United States Patent
Hammler et al.

(10) Patent No.: US 9,935,810 B1
(45) Date of Patent: Apr. 3, 2018

(54) METHOD AND APPARATUS FOR MODEL IDENTIFICATION AND PREDISTORTION

(71) Applicant: Xilinx, Inc., San Jose, CA (US)

(72) Inventors: Nikolaus H. Hammler, Stanford, CA (US); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/451,933

(22) Filed: Mar. 7, 2017

(51) Int. Cl.
*H04K 1/02* (2006.01)
*H04L 25/03* (2006.01)
*H04L 25/49* (2006.01)
*H04L 27/36* (2006.01)
*H04L 25/02* (2006.01)
*H04L 12/825* (2013.01)

(52) U.S. Cl.
CPC ........ *H04L 27/367* (2013.01); *H04L 25/0242* (2013.01); *H04L 47/25* (2013.01); *H04L 25/025* (2013.01)

(58) Field of Classification Search
CPC ........ H03F 1/3247; H03F 3/24; H03F 1/3241; H04L 27/368; H04L 7/0337; H04L 7/0334; H04L 7/033; H04L 7/0029; H03G 3/3042; H03L 7/091
USPC ............................. 375/295–297, 354–355
See application file for complete search history.

(56) References Cited

U.S. PATENT DOCUMENTS

| | | | | |
|---|---|---|---|---|
| 5,726,818 A * | 3/1998 | Reed | ........................ | G11B 5/09 360/51 |
| 5,949,813 A * | 9/1999 | Hunsinger | ............. | H04B 1/406 375/142 |
| 6,493,400 B1 * | 12/2002 | Greeley | ................. | H03F 1/3247 375/297 |
| 6,600,788 B1 * | 7/2003 | Dick | ................... | H03H 17/0235 375/232 |
| 7,274,762 B2 * | 9/2007 | Schenk | ................. | H04L 7/0062 375/232 |
| 7,876,854 B2 * | 1/2011 | Onggosanusi | ....... | H04B 7/0632 375/135 |
| 7,965,761 B2 * | 6/2011 | Shattil | .................. | H04B 1/7174 375/147 |
| 8,064,550 B2 * | 11/2011 | Chrabieh | ............ | H04L 27/3863 375/141 |

(Continued)

OTHER PUBLICATIONS

Zhu, Anding, "Decomposed Vector Rotation-Based Behavioral Modeling for Digital Predistortion of RF Power Amplifiers," IEEE Transactions on Microwave Theory and Techniques, Feb. 2015, pp. 737-744, vol. 63, No. 2, IEEE, Piscataway, New Jersey, USA.

(Continued)

*Primary Examiner* — James M Perez
(74) *Attorney, Agent, or Firm* — Hong Shi

(57) ABSTRACT

A model identification system includes an analog to digital converter (ADC). The ADC includes a conversion circuit configured to receive a first analog signal and generate a first digital signal including samples having a first rate by sampling the first analog signal at the first rate. The ADC further includes a first digital signal processing (DSP) circuit configured to generate a second digital signal including samples having a second rate less than the first rate based on the second digital signal and a first sampling matrix. The first sampling matrix is a block diagonal matrix including a plurality of diagonal blocks, each diagonal block is a row vector including a plurality of elements.

20 Claims, 22 Drawing Sheets

(56) References Cited

U.S. PATENT DOCUMENTS

| | | | | |
|---|---|---|---|---|
| 8,285,770 B1* | 10/2012 | Barnes | ............ | H03F 1/3247 |
| | | | | 708/300 |
| 8,532,215 B2* | 9/2013 | Huang | ............ | H03F 1/3247 |
| | | | | 375/267 |
| 8,711,974 B2* | 4/2014 | Kumar | ............ | H03F 1/3294 |
| | | | | 375/232 |
| 8,804,870 B2* | 8/2014 | Kim | ............ | H03F 1/304 |
| | | | | 375/297 |
| 9,026,064 B2* | 5/2015 | Wang | ............ | H04B 1/109 |
| | | | | 330/49 |
| 9,189,458 B1* | 11/2015 | Langer | ............ | G06F 17/16 |
| 9,337,886 B1* | 5/2016 | Dick | ............ | H04B 1/0475 |
| 9,362,942 B1* | 6/2016 | Hammler | ............ | H04B 1/62 |
| 9,455,760 B1* | 9/2016 | Dick | ............ | H03F 1/3247 |
| 9,660,593 B2* | 5/2017 | Abdelrahman | ............ | H03F 1/3247 |
| 2001/0037351 A1* | 11/2001 | Hellberg | ............ | H03H 17/02 |
| | | | | 708/313 |
| 2009/0116576 A1* | 5/2009 | Dowling | ............ | H04L 25/03343 |
| | | | | 375/267 |
| 2010/0172427 A1* | 7/2010 | Kleider | ............ | H04L 25/0232 |
| | | | | 375/260 |
| 2010/0316163 A1* | 12/2010 | Forenza | ............ | H04B 7/024 |
| | | | | 375/296 |
| 2011/0064171 A1* | 3/2011 | Huang | ............ | H03F 1/3247 |
| | | | | 375/346 |
| 2013/0163542 A1* | 6/2013 | Fettweis | ............ | H04W 72/044 |
| | | | | 370/329 |
| 2013/0223571 A1* | 8/2013 | Dark | ............ | H04B 1/0028 |
| | | | | 375/340 |
| 2014/0269841 A1* | 9/2014 | Goodman | ............ | H04B 1/715 |
| | | | | 375/133 |
| 2016/0065249 A1* | 3/2016 | Yang | ............ | H04B 1/0475 |
| | | | | 375/297 |
| 2016/0126903 A1* | 5/2016 | Abdelrahman | ............ | H04B 1/0475 |
| | | | | 330/149 |
| 2016/0191020 A1* | 6/2016 | Velazquez | ............ | H03H 21/0067 |
| | | | | 341/118 |

OTHER PUBLICATIONS

Hammler, Nikolaus et al., "Low-Rate Identification of Memory Polynomials," Proc. of the 2014 IEEE International Symposium on Circuits and Systems, Jun. 1, 2014, pp. 1034-1037, IEEE, Piscataway, New Jersey, USA.

Gautschi, Walter, "How (Un)stable Are Vandermonde Systems?", International Symposium on Asymptotic and Computational Analysis: Conference in Honor of Frank W.J. Oliver's 65th Birthday, (R. Wong, Editor), Lecture Notes in Pure and Applied Mathematics, 1990, vol. 124, pp. 193-210, Marcel Dekker, New York, New York, USA.

* cited by examiner

METHOD AND APPARATUS FOR MODEL IDENTIFICATION AND PREDISTORTION

TECHNICAL FIELD

Examples of the present disclosure generally relate to integrated circuits ("ICs") and, in particular, to an embodiment related to identifying models for unknown systems and performing digital predistortion for the unknown systems.

BACKGROUND

Integrated circuits may be used for transmitting data in communication systems. One of the essential components of the communication system is a power amplifier. The non-linearity of the power amplifiers creates spectral growth (broadening) beyond the signal bandwidth of a particular channel, which interferes with adjacent channels. It also causes distortions within the signal bandwidth of the particular channel, which decreases the bit error rate (BER) performance. While digital predistortion (DPD) techniques may be used to linearize a nonlinear power amplifier, it is challenging to meet the increasing performance requirements imposed by new applications in wireless communication.

Accordingly, an improved DPD system is desirable.

SUMMARY

In some embodiments in accordance with the present disclosure, a model identification system includes an analog to digital converter (ADC) including: a conversion circuit configured to receive a first analog signal and generate a first digital signal including samples having a first rate by sampling the first analog signal at the first rate. The ADC further includes a first digital signal processing (DSP) circuit configured to generate a second digital signal including samples having a second rate less than the first rate based on the first digital signal and a first sampling matrix. The first sampling matrix is a block diagonal matrix including a plurality of diagonal blocks, each diagonal block is a row vector including a plurality of elements.

In some embodiments, the model identification system includes a first system configured to generate the first analog signal based on a second analog signal, and provide the first analog signal to the ADC, wherein the second analog signal is generated based on a third digital signal; and a second DSP circuit coupled to the ADC. The second DSP circuit includes a model identification unit configured to receive the second digital signal and the third digital signal, and determine coefficients for a model of the first system based on the second digital signal and the third digital signal, and a second sampling matrix that matches the first sampling matrix.

In some embodiments, the first DSP circuit and the second DSP circuit are synchronized.

In some embodiments, the model identification unit is configured to determine the coefficients of the model of the first system using least squares (LS) or singular value decomposition (SVD).

In some embodiments, the second DSP circuit includes a predistortion unit configured to receive a fourth digital signal and generate the third digital signal by predistorting the fourth digital signal based on the coefficients for the model of the first system.

In some embodiments, the first system is a non-linear power amplifier.

In some embodiments, the first sampling matrix is a diagonal block random sign matrix. The first DSP circuit includes a first random number generator configured to provide a first sequence of random signs for the first sampling matrix.

In some embodiments, wherein the first random number generator includes a first linear-feedback shift register configured to generate the first sequence of random signs.

In some embodiments, the model identification unit includes a second random number generator configured to provide a second sequence of random signs for the second sampling matrix, wherein the second sequence of random signs match the first sequence of random signs.

In some embodiments, the first DSP circuit generates a first sample of the second digital signal based on a plurality of consecutive samples of the first digital signal, wherein a first size of the plurality of consecutive samples equals a second size of the elements of the row vector.

In some embodiments, a method includes receiving, by an analog to digital converter (ADC), a first analog signal; generating, by a conversion circuit of the ADC, a first digital signal including samples having a first rate by sampling the first analog signal at the first rate; and generating, by a first digital signal processing (DSP) circuit of the ADC, a second digital signal including samples having a second rate less than the first rate based on the first digital signal and a first sampling matrix, wherein the first sampling matrix is a block diagonal matrix including a plurality of diagonal blocks, each diagonal block is a row vector including a plurality of elements.

In some embodiments, the method includes generating, by a first system, the first analog signal based on a second analog signal, and provide the first analog signal to the ADC, wherein the second analog signal is generated based on a third digital signal; receiving, by a model identification unit of a second DSP circuit, the second digital signal from the ADC and the third digital signal; and determining, by a model identification unit, coefficients for a model of the first system based on the second digital signal, the third digital signal, and a second sampling matrix that matches the first sampling matrix.

In some embodiments, the method includes synchronizing the first DSP circuit and the second DSP circuit.

In some embodiments, the method includes receiving a fourth digital signal; and generating the third digital signal by predistorting the fourth digital signal based on the coefficients of the model of the first system.

In some embodiments, the first sampling matrix is a diagonal block random sign matrix, and the method includes generating, by a first random number generator, a first sequence of random signs for the first sampling matrix.

In some embodiments, the method includes providing, by a first linear-feedback shift register, the first sequence of random signs.

In some embodiments, the method includes generating, by a second random number generator, a second sequence of random signs matching the first sequence of random signs; and generating the second sampling matrix using the first sequence of random signs.

In some embodiments, the method includes generating a first sample of the second digital signal based on a plurality of consecutive samples of the first digital signal, wherein a first size of the plurality of consecutive samples equals a second size of the elements of the row vector of the first sampling matrix.

Other aspects and features will be evident from reading the following detailed description and accompanying drawings.

DETAILED DESCRIPTION

Figure 1:
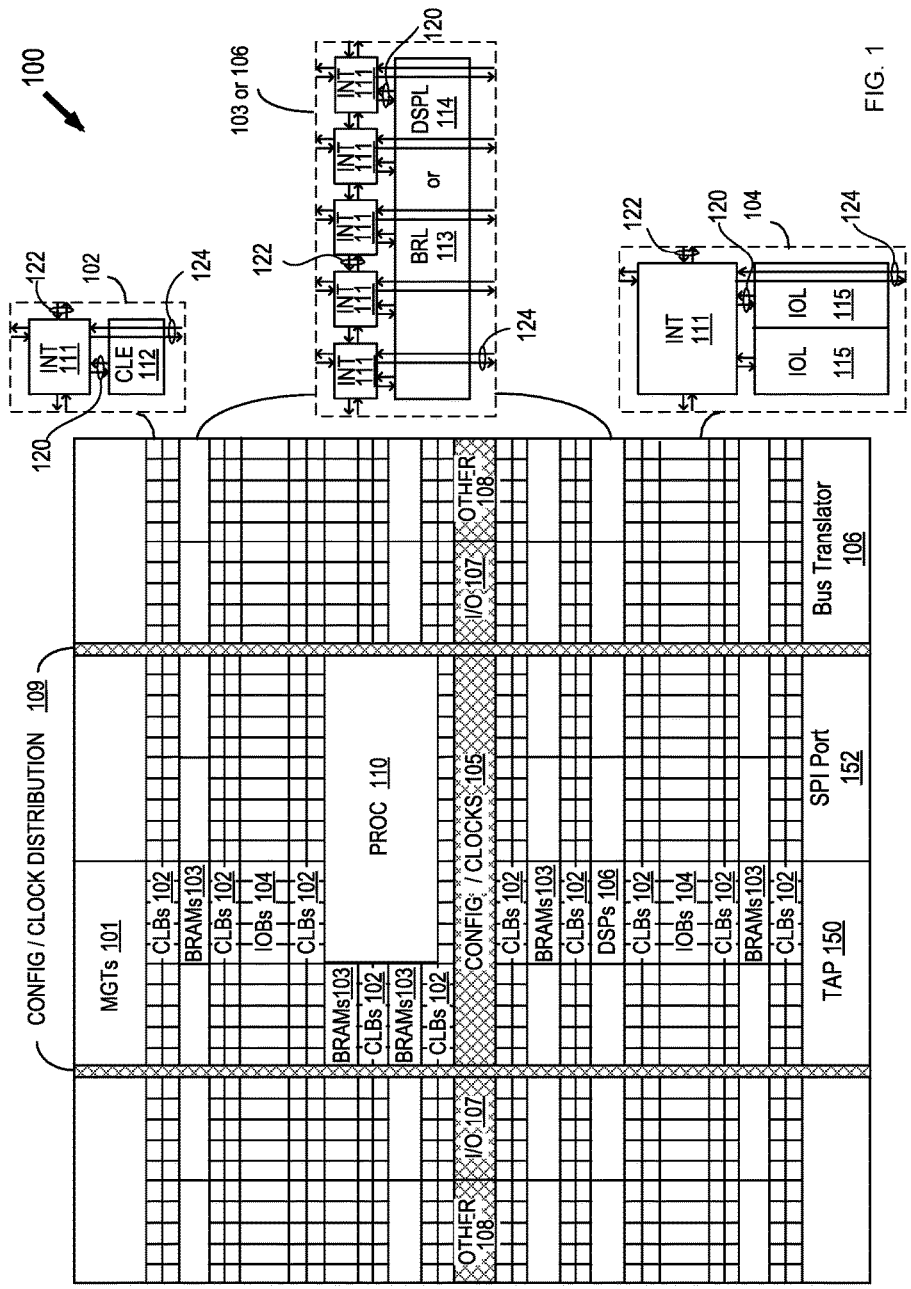
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. Power amplifiers are one of the essential components in communication systems and are inherently nonlinear. Nonlinearity in power amplifiers causes spectral growth beyond the signal bandwidth of a particular channel, which interferes with adjacent channels. It also causes distortions within the signal bandwidth, causing an increased bit error rate at a receiver. In various embodiments, DPD systems may be used to compensate for various distortions in power amplifiers, thereby reducing adjacent channel power ratio (ACPR) of the communication systems. For example, in a base station of a massive multiple-input multiple-output (MIMO) communication system, each of a plurality of transmit antennas may be associated with a DPD system. Each DPD system may have a feedback path using a high-rate, high-resolution ADC (e.g., a 16-bit ADC with a sampling rate of 491.52 MHz), which results in a high data rate (e.g., 8 Gbit/s) transferring from that ADC to the DSP unit of the base station. As such, the base station of that massive MIMO system may need an aggregate data rate of more than 0.5 Tbit/s between the ADCs of the DPD systems and the DSP of the base station, which makes connectivity challenging. It has been discovered that a DPD system may use an ADC configured to output samples at a lower rate than the sampling rate of the ADC, which may result in a decreased data rate between the ADC and the DSP of the base station, and reduced computational complexity by reducing the number of complex multiplications.

With the above general understanding borne in mind, various embodiments for model identification and predistortion are described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IO 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the DPD system to compensate for distortion in a power amplifier is not limited to the exemplary IC depicted in FIG. 1, and that IC having other configurations, or other types of IC, may also implement the model identification and predistortion functions.

Figure 2:
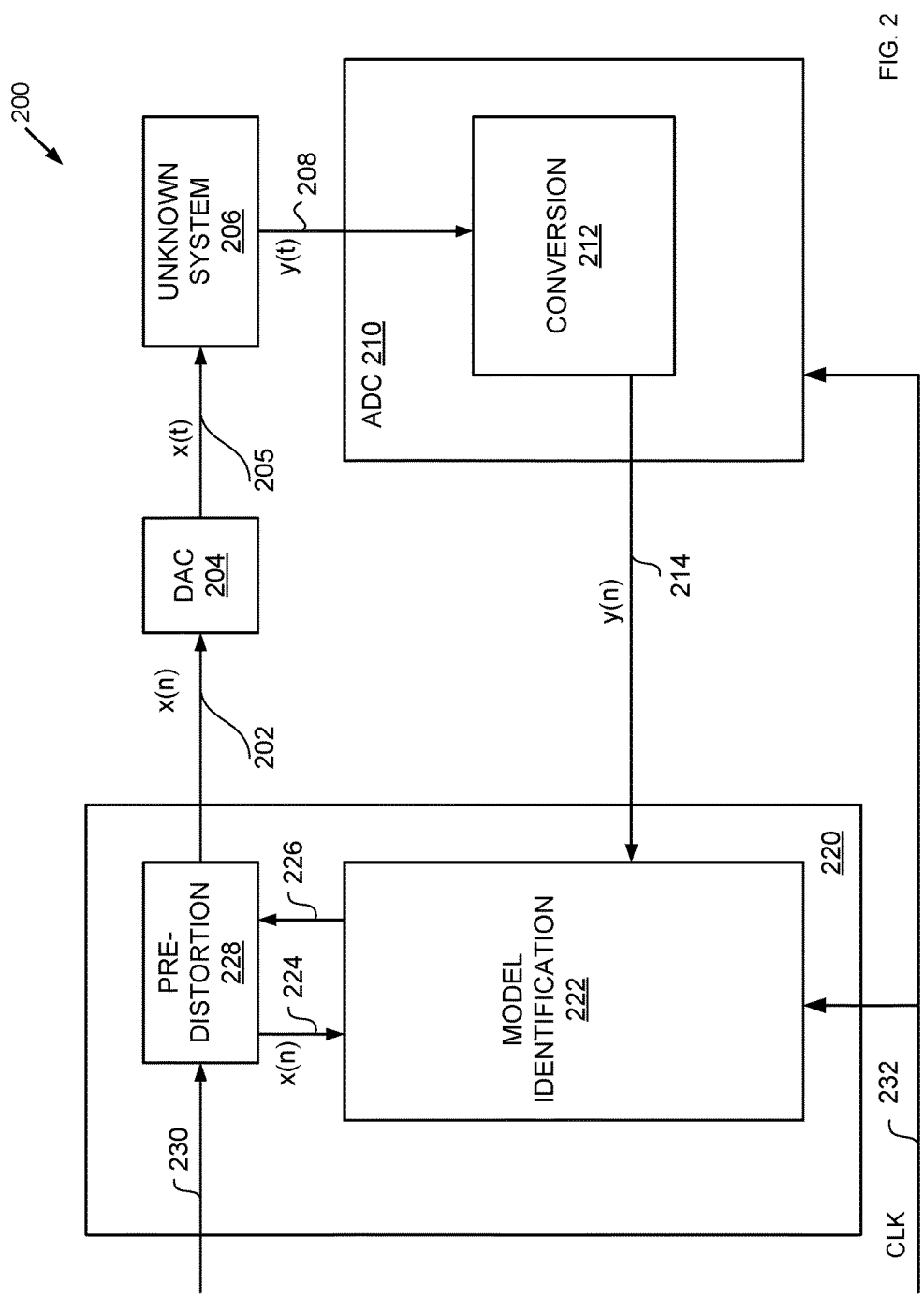
FIG. 2 is a block diagram illustrating a DPD system according to some embodiments of the present disclosure.

Referring to FIG. 2, illustrated is a DPD system 200 (also referred to as a model identification system 200). A digital signal x(n) 202 is input to a digital to analog converter (DAC) 204. The DAC 204 may sample the digital signal x(n) 202 at a predetermined sampling rate $f_{s1}$. The predetermined sampling rate $f_{s1}$ indicates that the sampling is performed every predetermined period ($T_{s1}$). In some embodiments, the predetermined sampling rate $f_{s1}$ corresponds to the Nyquist rate ($f_s$) of the system 200. The DAC 204 may then convert the samples to an analog signal x(t) 205, and outputs the analog signal x(t) 205 to an unknown system 206, such as a non-linear, frequency dependent power amplifier and/or one or more other components. A system model of the unknown system 206 may represent characteristics of the unknown system 206, and coefficients of the system model are unknown.

The unknown system 206 receives the analog signal x(t) 205, and outputs an analog signal y(t) 208 to an ADC 210. The ADC 210 includes a conversion unit 212, which samples the analog signal y(t) 208 at a predetermined sampling rate $f_{s2}$ and converts the samples into digital signal values in a digital signal y(n) 214. The predetermined sampling rate $f_{s2}$ indicates that sampling is performed every predetermined period ($T_{s2}$). In some embodiments, the predetermined sampling rate $f_{s2}$ corresponds to the Nyquist rate ($f_s$) of the system 200.

In some embodiments, the ADC 210 provides the digital signal y(n) 214 to a DSP unit 220. In such embodiments, the connection between the ADC 210 and the DSP unit 220 may have a data rate that is the same as the data rate of the digital signal y(n) 214 generated by the conversion unit 212. The DSP unit 220 includes a model identification unit 222 that may perform a model identification process, and a predistortion unit 228 that may perform a digital predistortion process. In some embodiments, the DSP unit 220 and its components may be synchronized with the ADC 210 using a clock signal 232.

Figure 3:
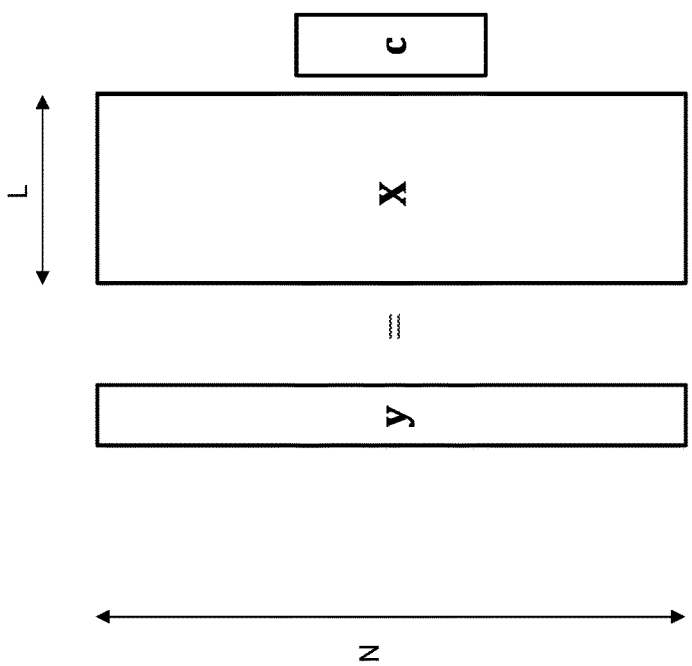
FIG. 3 is a block diagram illustrating a model identification problem according to some embodiments of the present disclosure.

In some embodiments, the model identification unit 222 receives a digital signal 224 including the digital signal values x(n) from the predistortion unit, receives the digital signal y(n) 214 from the ADC 210, and performs a model identification process to determine coefficients of a system model of the unknown system 206. The model identification unit 222 may use various methods (e.g., a least squares (LS) method, a singular value decomposition (SVD) method) to determine the coefficients based on the samples of the digital signal x(n) received from the signal 224 and the digital signal y(n) 214, where the model identification problem may be provided as follows:

$$y = Xc + e, \quad (1)$$

where y is an N×1 vector including N available samples from the digital signal y(n), X is an N×L matrix including corresponding samples from the digital signal x(n), and c is an L×1 vector including L unknown coefficients of the system model of the unknown system 206, and e is an error vector. In an example, e is i.i.d. Gaussian noise. Referring to FIG. 3, illustrated is a block diagram illustrating the model identification problem and the relationships between y, X, and c according to the simplified equation 1).

As such, the model identification unit 222 may compute the coefficients ĉ of the system model for the unknown system 206 as follows:

$$\hat{c} = (X^H X)^{-1} X^H y,$$

where ĉ is the estimated model coefficients.

Note that in various embodiments, N may be a very large number (e.g., 4,915,200). In various embodiments, a smaller measurement number M (e.g., M=4096) of the total available samples of x(n) and y(n) are used to solve the model identification problem. In such case, by introducing a sampling matrix D having M rows to perform a linear matrix transformation to equation (1), the model identification problem may be described as follows:

$$Dy = DXc. \quad (2)$$

Equation (2) may be rewritten as follows:

$$z = Ac, \quad (3)$$

where z=Dy, and A=DX. Note that z and D have the same number of rows, and that number of rows of z and D is also referred to as the measurement number M.

Figure 4:
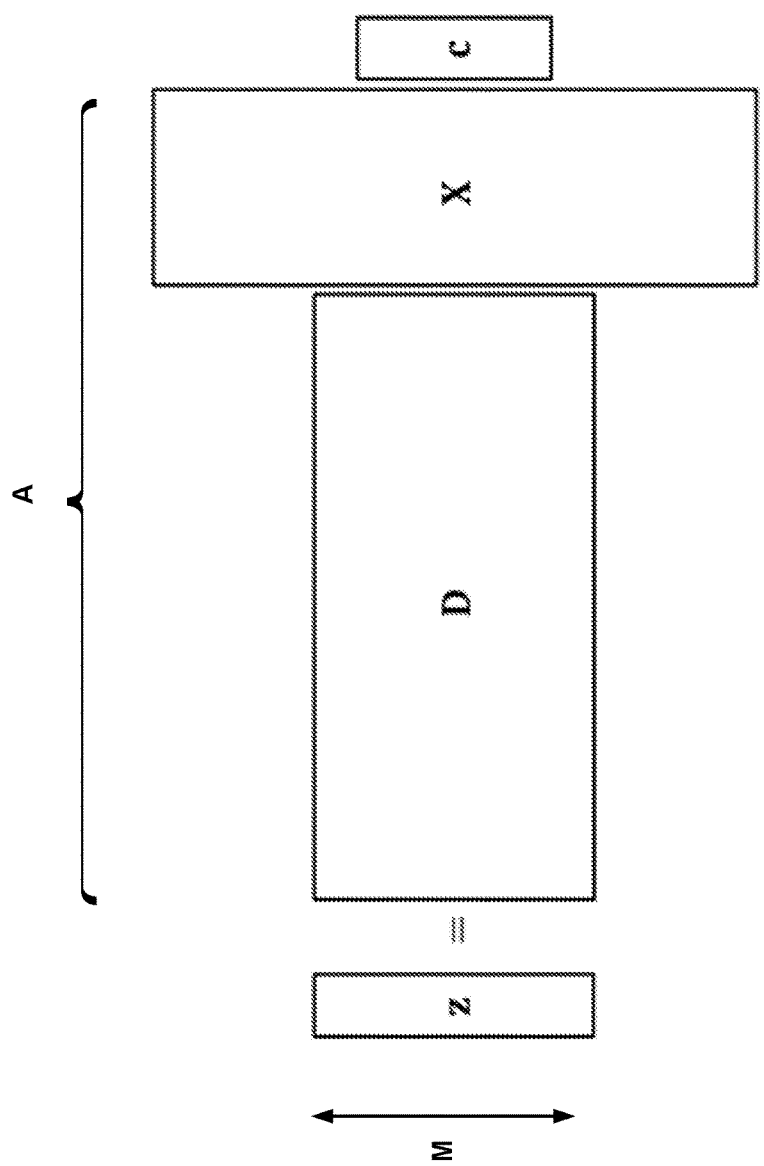
FIG. 4 is a block diagram illustrating a model identification problem according to some embodiments of the present disclosure.

Referring to FIG. 4, illustrated is a block diagram illustrating model identification problem and the relationships between z, D, X, A, and c according to the equations (2) and (3).

Figure 5:
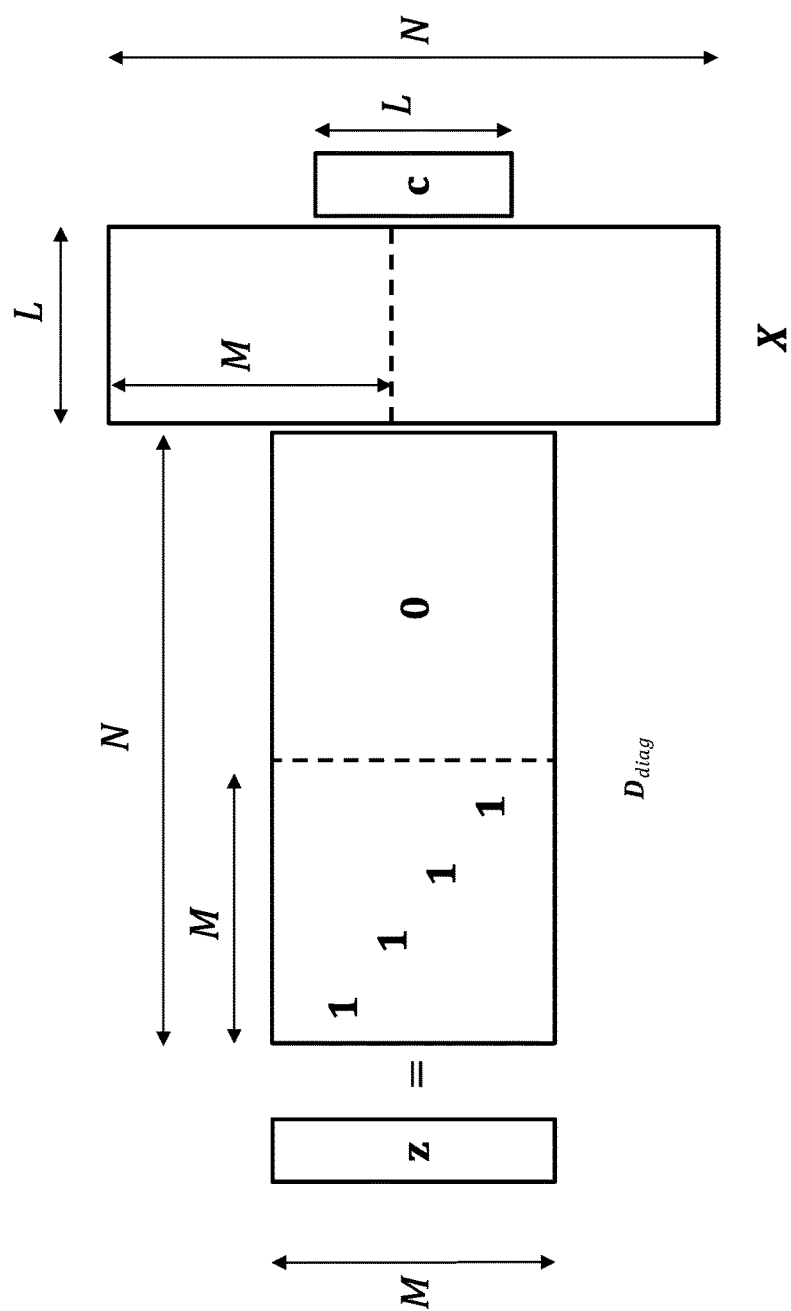
FIG. 5 is a block diagram illustrating a model identification problem according to some embodiments of the present disclosure.

In an example where the model identification problem is solved using y(n) directly, the sampling matrix D may be a diagonal matrix $D_{diag}$ expressed as follows:

$$D_{diag} = [I_{M \times M}, 0, \ldots, 0].$$

where both the number of chosen samples of y(n) and the row number of the z and $D_{diag}$ are equal to the measurement number M. Referring to FIG. 5, illustrated is a block diagram illustrating model identification problem and the relationships between z, $D_{diag}$, X, A, and c according to the equations (2) and (3).

As such, the model identification unit 222 may compute the coefficients ĉ of the model identification problem as follows:

$$\hat{c} = (A^H A)^{-1} A^H z.$$

In some embodiments, M is an integer chosen to be greater than L. In some embodiments, because of noise, model mismatch, and imperfections, M may be an integer much greater than L. In an example where L is between about 20 and 100, M may be equal to or greater than 4096. As M increases, the accuracy of the coefficients ĉ increases, but a time necessary to determine the coefficients ĉ also increases.

In some embodiments, a mean square error (MSE) may be used to determine the error of the coefficients ĉ. For a Maximum likelihood estimator, the covariance matrix is the inverse of the Gram matrix $A^H A$. The mean square error (MSE) of the model coefficients ĉ may be computed as follows:

$$\|\hat{c} - c\|_2^2 = \sigma_e^2 Tr\big((A^H A)^{-1}\big),$$

where $\sigma_e^2$ represents a measurement noise variance. In an experimental design, this corresponds to an A-optimal design, and such an MSE may be used to evaluate the properties of the coefficients ĉ. In the discussion below, because $Tr((A^H A)^{-1})$ is proportional to the MSE, the values of $Tr((A^H A)^{-1})$ may be used to describe the behavior of MSE.

In some embodiments, parameters of interest in a DPD system 200 includes, for example, normalized mean square error (NMSE) and ACPR. Both NMSE and ACPR depend on the MSE, which may be defined by spectral properties of A, including for example, $Tr(A^H A)^{-1})$ and a condition number K. While $Tr(A^H A)^{-1})$ may describe the average error behavior (e.g., using MSE), the condition number K describes the worst case. The condition number K may be computed as follows:

$$K = \frac{\sigma_{max}(A)}{\sigma_{min}(A)},$$

where $\sigma_{max}(A)$ and $\sigma_{min}(A)$ are maximal and minimal singular values of A respectively.

In some embodiments, various system models may be used to model the characteristics of the unknown system 206. In some examples, the system model is a linear-in-parameters model. In some examples, the system model is a nonlinear memoryless model without any memory effect. Such nonlinear memoryless models may include, for example, a polynomial model.

In some examples, the system model is a nonlinear memory model, which considers the memory effects of the unknown system 206. Such memory models may include, for example, a generalized memory polynomial model (GPM), and a Volterra model. An example memory polynomial model that provides a good tradeoff between complexity and performance is provided as follows:

$$y[n] = \sum_{p=1}^{P} \sum_{q=0}^{Q} c_{p,q} |x[n-q]|^{p-1} x[n-q], \tag{3}$$

where $c_{p,q}$ are coefficients of the model of the unknown system 206, P is the polynomial order, and Q is a memory depth. In this example, the total number L of unknown coefficients $c_{p,q}$ is equal to P*(Q+1).

Note that in various embodiments, using the sampling matrix $D_{diag}$ may not improve the condition of A. For example, a nonlinear memoryless model using the Taylor series may be expressed as follows:

$$y[n] = \sum_{l=1}^{L} c_l \Psi_l(x[n]), \text{ where } \Psi_l(x[n]) = |x[n]|^{l-1} x[n], \tag{4}$$

where L is a positive integer, and is the total number of coefficients $c_l$.

Accordingly, the matrix X may be factored as follows:

$$X = \text{diag}(e^{j\angle x[1]}, e^{j\angle x[2]}, \ldots )V;$$

$$V = \begin{bmatrix} |x[1]| & |x[1]|^2 & \ldots \\ |x[2]| & |x[2]|^2 & \ldots \\ \vdots & \vdots & \ddots \end{bmatrix}.$$

Here, V is a real-valued Vandermonde matrix and may be badly conditioned. Because A is still Vandermonde after multiplying V with $D_{diag}$, using the sampling matrix $D_{diag}$ may not improve the condition of A.

After determining the coefficients ĉ of the system model of the unknown system 206, the model identification unit 222 sends the coefficients ĉ to the predistortion unit 228 of the DSP unit 220. The predistortion unit 228 may receive a digital signal 230, and perform a predistortion to the digital signal 230 according to the system model (including the coefficients ĉ) of the unknown system 206 to generate the digital signal x(n) 202, which may also be referred to as the predistorted digital signal x(n) 202. The predistortion may compensate for various distortions (e.g., non-linearity) of the unknown system 206, thereby improving the performance of the DPD system 200.

The predistortion unit 228 may be performed using various methods including, for example, a direct learning self-tuning regulator (STR) method, a direct learning model the reference adaptive system (MRAS). In a particular example, the predistortion unit 228 uses a pth-order pre-inverse open loop direct learning model. In that particular example, the predistortion unit 228 may invert the system model provided by the coefficients ĉ provided by the model identification unit 222, and perform a predistortion according to the inverted system model.

Figure 6:
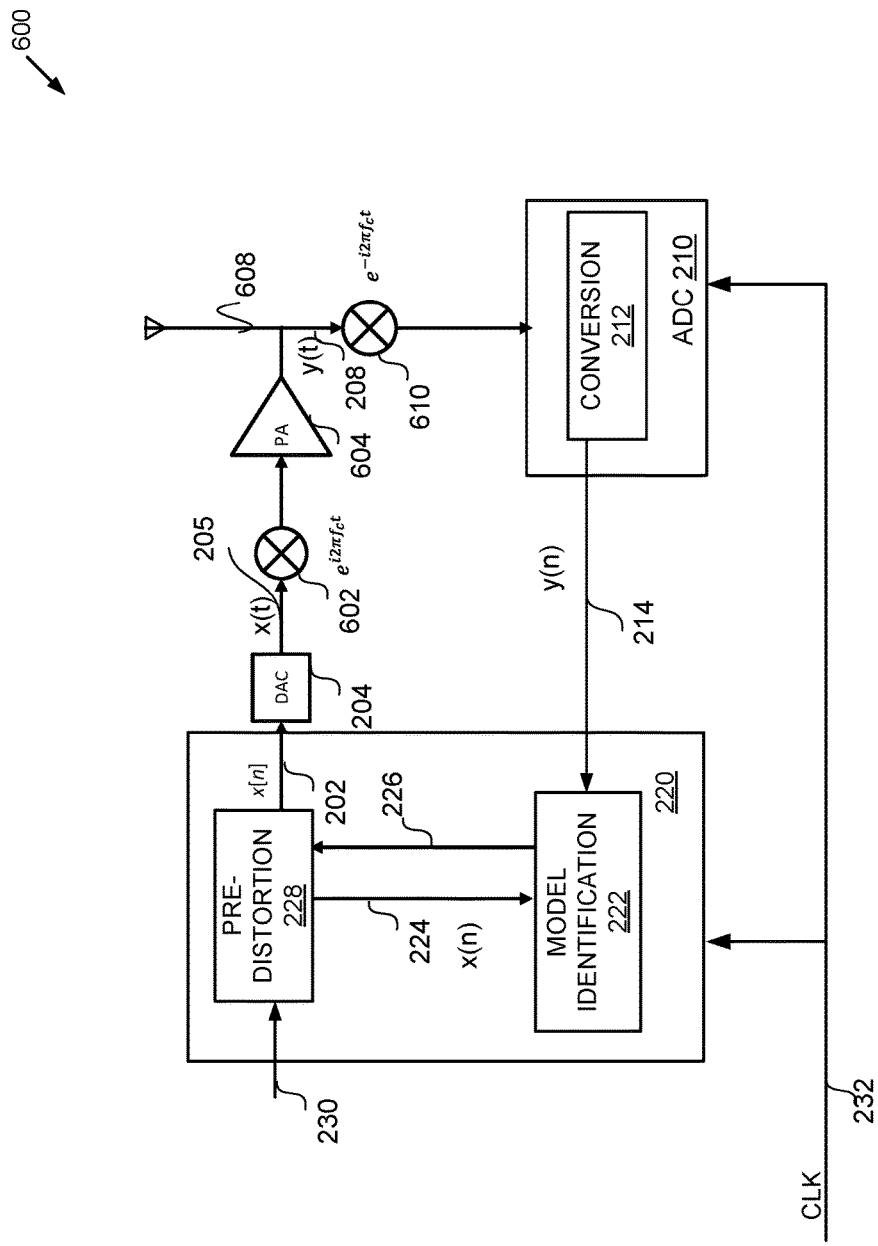
FIG. 6 is a block diagram illustrating a DPD system according to some embodiments of the present disclosure.

Referring to FIG. 6, illustrated is a block diagram of a DPD system 600 (also referred to as a model identification system 600), which is substantially similar to the DPD system 200 of FIG. 2 described above other than the differences described below. The DPD system 600 may be a transmit portion (e.g., a transmitter) of a wireless transceiver (e.g., a base station of a massive MIMO communication system). As shown in the example of FIG. 6, the DPD system 600 includes a DSP unit 220. A predistortion unit 228 of the DSP unit 220 receives a digital signal 230 that is to be wirelessly transmitted by one or more transmit antennas, such as transmit antenna 608. The predistortion unit 228 performs a digital predistortion to the digital signal to 230 produce a predistorted digital signal x(n).

As shown in FIG. 6, a DAC 204 converts the predistorted digital signal x(n) 202 into an analog signal x(t), and outputs the analog signal x(t) to a power amplifier 604. The power amplifier 604 has characteristics that may be modeled using a system model including unknown coefficients, and corresponds to the unknown system 206 of the DPD system 200. The power amplifier 604 amplifies the analog signal x(t) and applies the amplified analog signal to the transmit antenna 608 to perform wireless communication. For example only, the wireless communication may be according to an IEEE 802.11 communication standard or another wireless communication standard. In the example of FIG. 6, the analog signal x(t) is upconverted using an upconverter 602 before being input to the power amplifier 604.

As shown in FIG. 6, the amplified analog signal y(t) 208 is sent to a feedback path including the ADC 210, where a conversion unit 212 may convert the analog signal y(t) 208 to a digital signal y(n) 214. In the example of FIG. 6, the analog signal y(t) 208 is downconverted using a downconverter 610 before being input to the ADC 210.

The model identification unit 222 receives the digital signal y(n) 214 from the ADC 210, and determines the coefficients of the system model of the power amplifier 604 based on the digital signal x(n) and the digital signal y(n). The predistortion unit 228 receives a signal 226 including the coefficients of the system model of the power amplifier 604 from the model identification unit through the signal 226, and performs a predistortion to the digital signal 230 according to the system model of the power amplifier 604.

In various embodiments, using the DPD system 600 in a massive MIMO communication system may impose various challenges. In an example, a base station of a massive MIMO communication system includes 100 transmit antennas with 100 corresponding DPD systems. The base station may include a DSP unit that performs a digital signal process for all those DPD systems. The connection between the ADCs of those DPD systems and the DSP unit may become a bottleneck because of the large aggregate data rate. In an example where each DPD system uses a 16-bit ADC at a sampling rate of 491.51 MHz, a data rate of 8 Gbit/s may be transferred from a single ADC to the DSP unit. As such, in the massive MIMO communication system with 100 transmit antennas, the connection between the DSP unit and the ADCs may have an aggregate data rate of more than 0.5 Tbit/s, which makes connectivity between the ADCs and the DSP unit challenging. Referring to FIGS. 7 through 16D, a model identification method for reducing the data rate between the ADCs and the DSP unit is described. As described in detail below, by using a DSP block in an ADC to compress samples, the ADC may output a digital signal having a data rate less than the sampling rate of the ADC, and a decreased data rate between the ADC and the DSP unit may be achieved.

Figure 7:
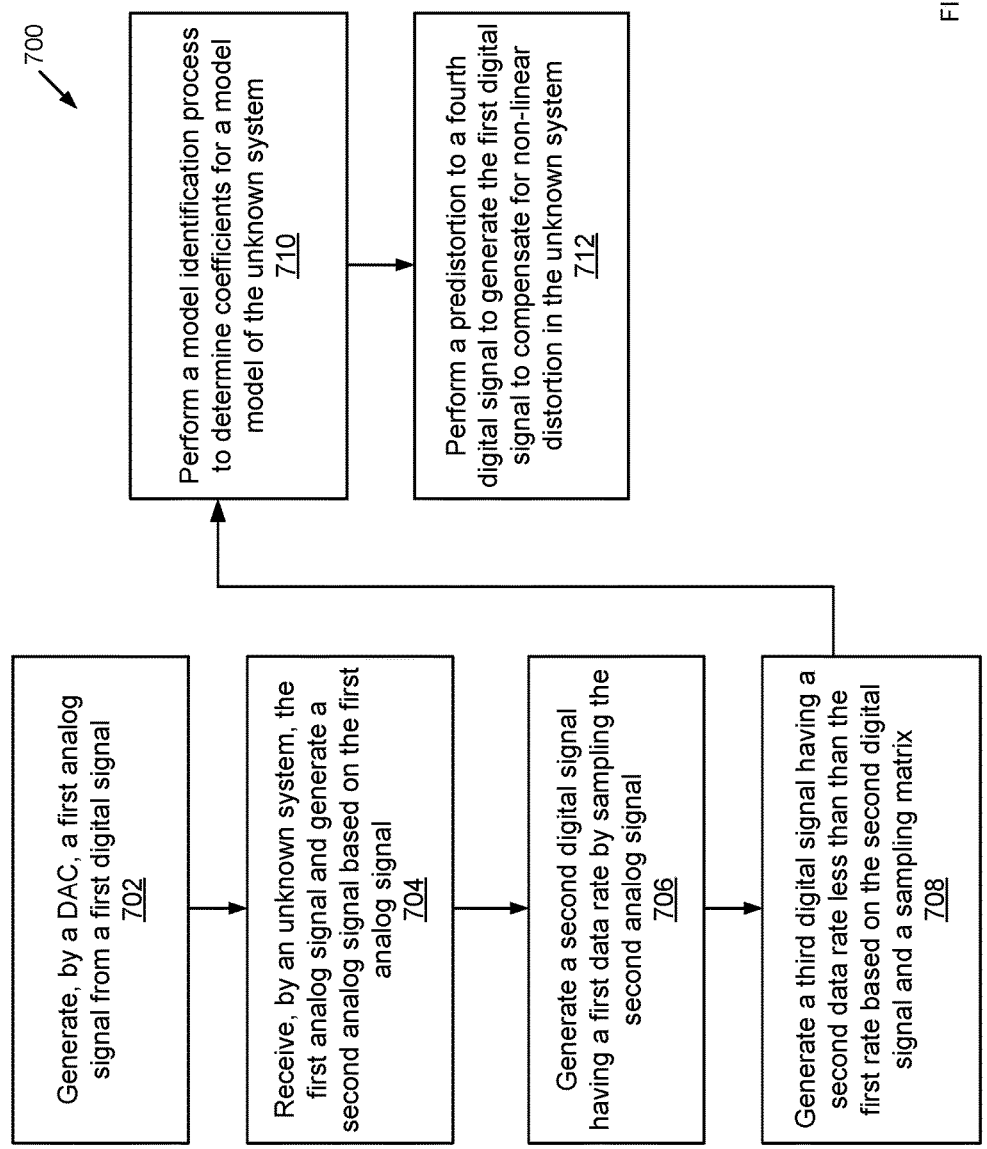
FIG. 7 is a flow chart illustrating a model identification method according to some embodiments of the present disclosure.
Figure 8A:
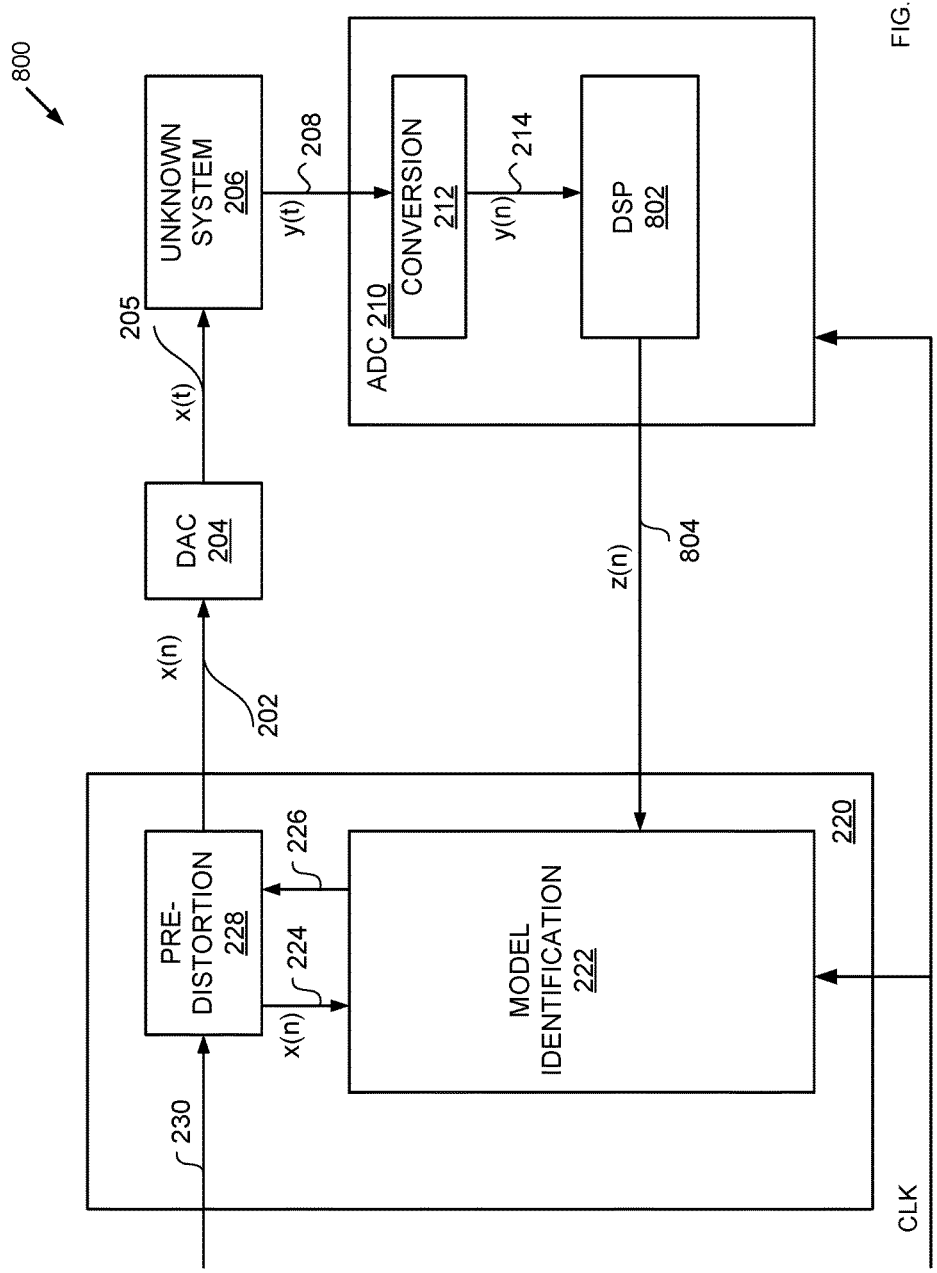
FIG. 8A is a block diagram illustrating a DPD system according to some embodiments of the present disclosure.
Figure 8B:
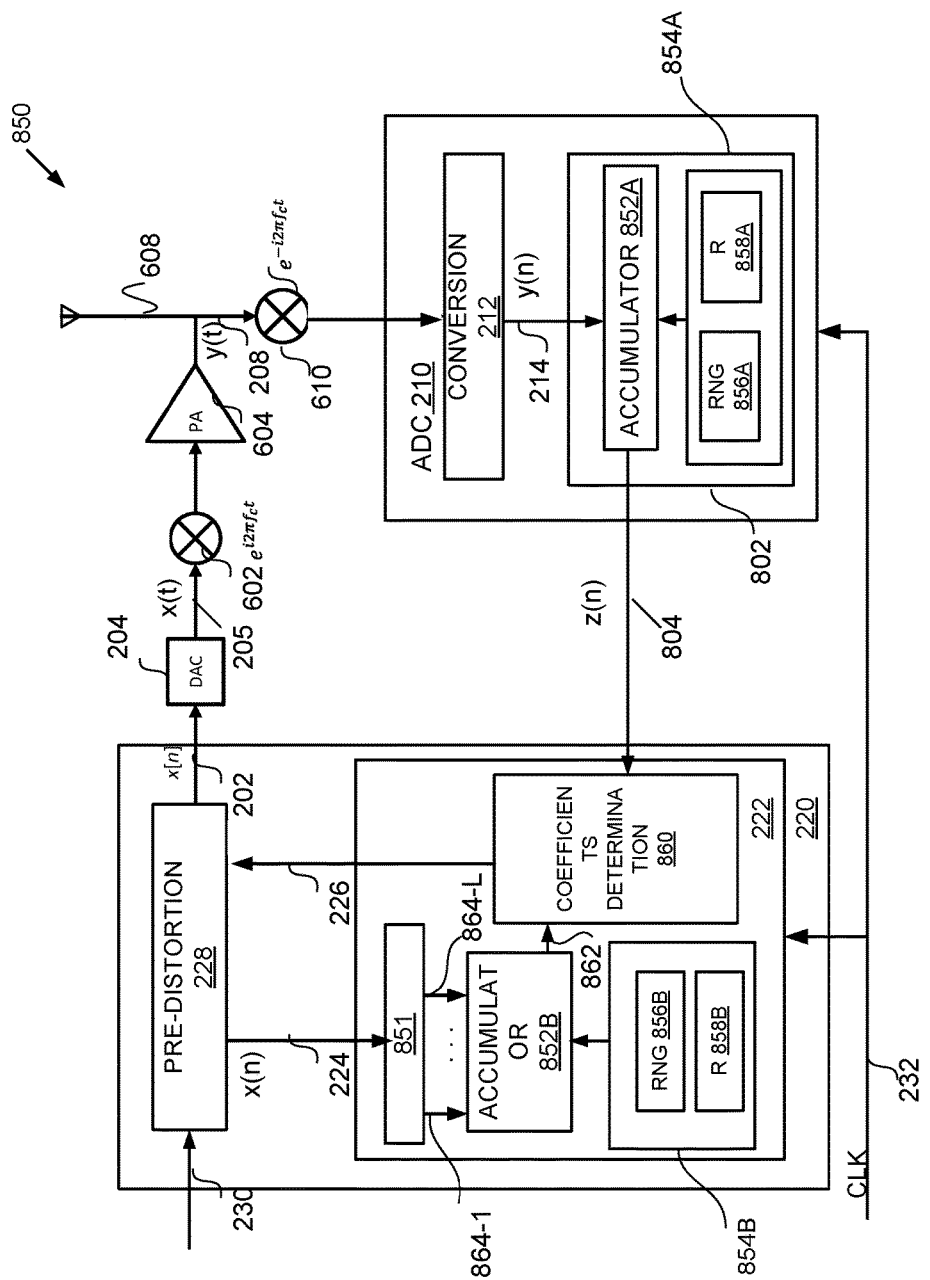
FIG. 8B is a block diagram illustrating a DPD system according to some embodiments of the present disclosure.

Referring to FIG. 7, illustrated is a method 700 for determining coefficients of a power amplifier model, and performing digital predistortion in a DPD system. Referring to FIGS. 8A and 8B, illustrated are examples of DPD systems that may perform the method 700. Specifically, the DPD system 800 of FIG. 8A and the DPD system 850 of FIG. 8B are substantially similar to the DPD system 200 of FIG. 2 and the DPD system 600 of FIG. 6, other than the differences described below.

The method 700 begins at block 702, where a DAC receives a first digital signal and converts the first digital signal to an analog signal. Referring to FIGS. 8A and 8B, at block 702, the DAC 204 receives a digital signal x(n) 202, and outputs an analog signal x(t). In an example, the DAC 204 samples the digital signal x(n) 202 at a predetermined sampling rate, converts the samples to an analog signal x(t) 205, and outputs the analog signal x(t) 205.

The method 700 may then proceed to block 704, where an unknown system receives the first analog signal, and generates a second analog signal based on the first analog signal. Referring to FIG. 8A, the unknown system 206 receives an analog signal x(t) 205, and generates an analog signal y(t) 208 based on the analog system x(t). Referring to FIG. 8B, an unknown system including a power amplifier 604 receives the analog signal x(t), and generates an analog signal y(t) by amplifying the analog signal x(t).

The method 700 may then proceed to block 706, where a second digital signal having a first data rate is generated by sampling the second analog signal. Referring to FIGS. 8A and 8B, a conversion unit 212 of the ADC 210 receives the analog signal y(t) 208, samples the analog signal y(t) 208 at a predetermined sampling rate, and converts the samples into a digital signal y(n) 214. In an example, the predetermined sampling rate is the Nyquist rate ($f_s$), and the digital signal y(n) 214 may have a data rate corresponding to the Nyquist rate ($f_s$). For example, for an ADC having a resolution of 16 bits and using a Nyquist rate ($f_s$) of 491.52 MHz as its sampling rate, the data rate of the digital signal y(n) 214 may be equal to 16*$f_s$, which is about 8 Gbit/s.

The method 700 may then proceed to block 708, where a third digital signal having a second data rate less than the first data rate is generated. Referring to FIG. 8A, the ADC 210 includes a DSP unit 802, which receives the digital signal y(n) 214 from the conversion unit 212, and generates a digital signal z(n) 804 having a data rate less than the data rate of the data rate of the digital signal y(n) 214. In an example, the ADC 210 and its DSP unit 802 are contained in the same die.

Referring to FIG. 8B, the DSP unit 802 includes an accumulator 852A and a sampling matrix unit 854A. In various embodiments, the sampling matrix unit 854A may provide elements of a sampling matrix D. The accumulator 852A may receive the sampling matrix D or elements thereof, perform a compression process by combining the samples of the digital signal y(n) based on the corresponding elements of the sampling matrix D, and generate a digital signal z(n) including the resulting samples. In an example, the accumulator 852A may include an adder/subtractor for adding or subtracting the samples of y(n). As such, the DSP unit 802 is referred to as a compression unit 802 in the discussion below. By choosing the appropriate sampling matrix D, the digital signal z(n) may have the desired data rate (e.g., less than the data rate of the digital signal y(n)).

In various embodiments, the sampling matrix D may be a block diagonal matrix $D_{blkdiag}$ expressed as follows:

$$D_{blkdiag} = \text{normalizer} * \text{diag}(d_1, d_2, \ldots, d_M, 0, \ldots, 0),$$

where $D_{blkdiag}$ has M rows and N columns, $d_i$ is a 1×R vector, and M, N, and R are positive integers, R is greater than one, and a normalizer (e.g., $1/\sqrt{R}$) is used to normalize the compressed samples in the digital signal z(n). The vector $d_i$ may also be referred to as the $i^{th}$ diagonal block of the block diagonal matrix $D_{blkdiag}$. The integer R may also be referred to as a diagonal block width of the diagonal block $d_i$. Note that by $D_{blkdiag}$, the number of chosen samples of y(n) is not equal to the measurement number M. Instead, the number of chosen samples of y(n) equals to M*R. In some embodiments, using a sampling matrix $D_{blkdiag}$ introduces additional degrees of freedom to be exploited for solving the model identification problem as provided by equation (3).

In an example, the diagonal block matrix $D_{blkdiag}$ may be a diagonal block matrix $D_{blkones}$ where each element of its $1^{st}$ through $M^{th}$ diagonal blocks is equal to one. By setting each $d_i$ of $D_{blkdiag}$ to $1_{1 \times R}$, we obtain the diagonal block matrix $D_{blkones}$ as follows:

$$D_{blkones} = \frac{1}{\sqrt{R}} \text{diag}(1_{1 \times R}, 1_{1 \times R}, \ldots, 1_{1 \times R}, 0, \ldots, 0).$$

Figure 9:
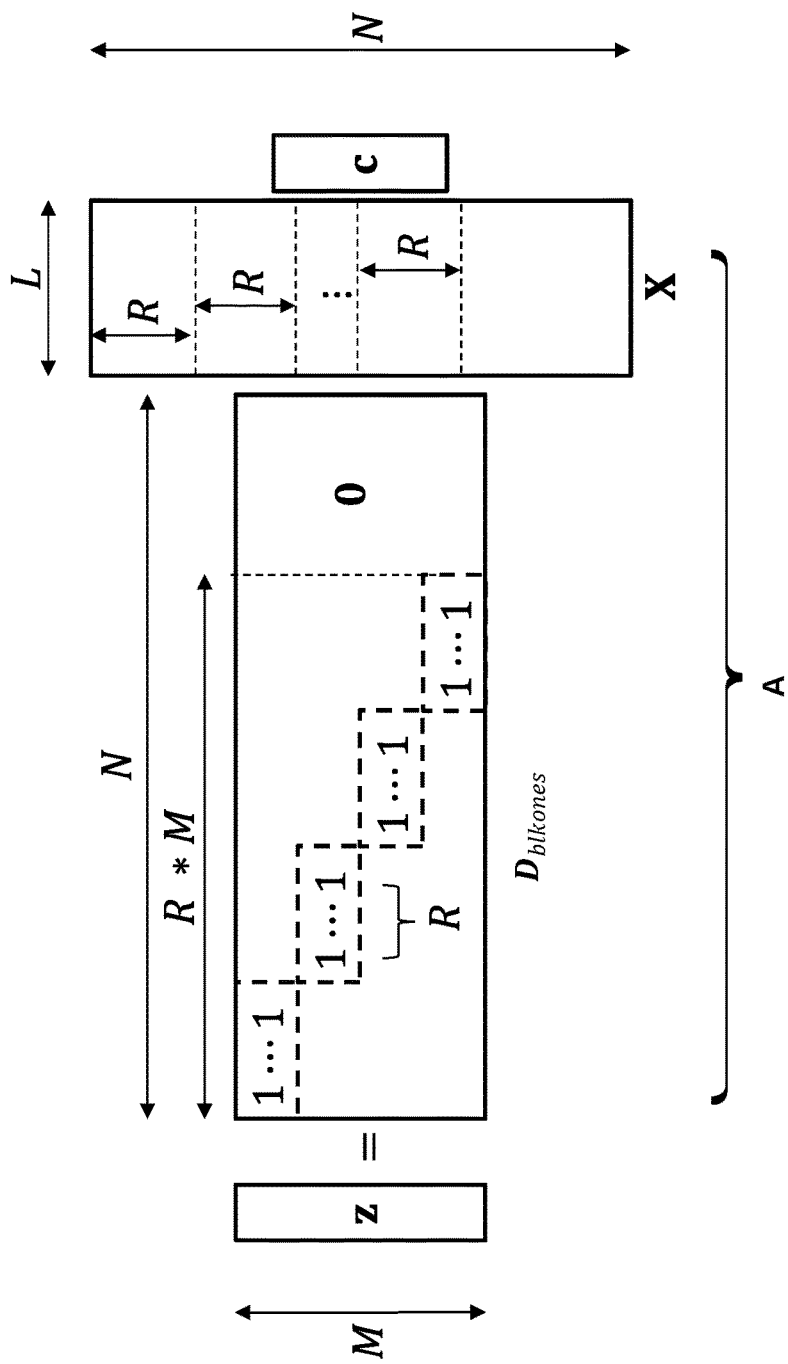
FIG. 9 is a block diagram illustrating a model identification problem according to some embodiments of the present disclosure.

Referring to FIG. 9, illustrated is a diagram illustrating the model identification problem and the relationships between z, $D_{blkones}$, X, A, and c according to equation (2) and (3) using a sampling matrix $D_{blkones}$. As shown in FIG. 9, for the $i^{th}$ column of the matrix X, where i is an integer between 1 and L, the matrix multiplication of $D_{blkones}$ and the $i^{th}$ column of X for generating A may include M accumulation processes, each accumulation process adds the corresponding consecutive R samples of the $i^{th}$ column of X to generate a corresponding element of A.

Similarly, the matrix multiplication of $D_{blkones}$ and y for generating z may include M accumulation processes, each accumulation process adds the corresponding consecutive R samples of y(n) to generate a corresponding element of z.

As such, the compression unit 802 may use the digital signal y(n) to generate a digital signal z(n) corresponding to z of the equation (3) by combining corresponding consecutive R samples of y(n) according to the sampling matrix $D_{blkones}$. The $m^{th}$ sample of the digital signal z(n) may be expressed as follows:

$$z[m] = \frac{1}{\sqrt{R}} \sum_{r=1}^{R} y[(m-1)R + r].$$

Figure 10:
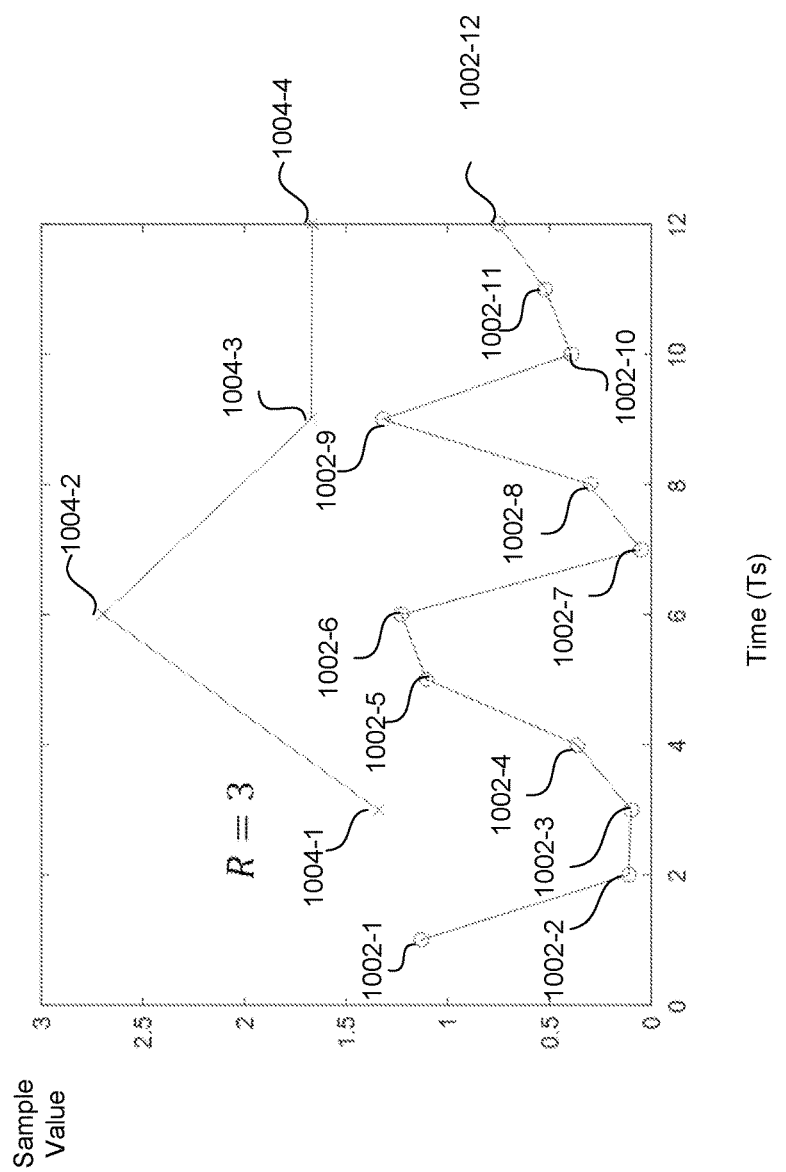
FIG. 10 illustrates various digital signals of a DPD system according to some embodiments of the present disclosure.

Referring to FIG. 10, illustrated are samples of the digital signal z(n) 804 and corresponding samples of the digital signal y(n) 214. In the illustrated example, the compression unit 802 generates the digital signal z(n) 804 based on the digital signal y(n) 214 and the sampling matrix $D_{blkones}$, where the diagonal block width R of the sampling matrix $D_{blkones}$ has a value of three. As shown in FIG. 10, samples 1002-1 through 1002-12 correspond to consecutive samples of y(n), where each sample may take a time period of $T_s$. Samples 1004-1 through 1004-4 correspond to consecutive samples of z(n) generated based on samples of y(n). Specifically, the sample 1004-1 of z(n) is generated by adding the samples 1002-1, 1002-2, and 1002-3 of y(n). The sample 1004-2 of z(n) the samples 1002-4, 1002-5, and 1002-6. The sample 1004-3 of z(n) may be generated by adding the samples 1002-7, 1002-8, and 1002-9 of y(n). The sample 1002-4 may be generated by adding the samples 1002-10, 1002-11, and 1002-12. As shown in FIG. 10, each of the samples 1004-1 through 1004-4 of z(n) may take a time period of $R*T_s$. In an example, the data rate $DR_{blkdiag}$ of z(n) at the output 804 of the ADC may be computed as follows:

$$DR_{blkdiag} = w/(R*T_s),$$

where w is the resolution of the ADC 210 (e.g., 16 bits). On the other hand, the data rate of the digital signal y(n), which is the output data rate of the ADC 210 in DPD systems 200 and 600 of FIGS. 2 and 6, may be computed as follows:

$$DR_{diag} = w/T_s.$$

As such, by using the compression unit 802 to perform a compression process according to the sampling matrix $D_{blkones}$, the output data rate of the ADC 210 may be reduced by a factor of R compared to the ADC 210 of the DPD systems 200 and 600 of FIGS. 2 and 6.

Note that by using a sampling matrix $D_{blkdiag}$, the identification time of the DPD system 850 is increased by a factor of R compared to the DPD systems 200 and 600 of FIGS. 2 and 6, when the same measurement number M is used. For example, as shown in FIG. 10, in the DPD system 850, each sample in z(n) is generated using $R*T_s$. As such, the identification time of the DPD system 850 for generating M samples equals $M*(R*T_s)$. On the other hand, in the DPD system 200, each sample in y(n) is generated using $T_s$, and therefore its identification time is $M*T_s$.

By using the sampling matrix $D_{blkdiag}$, the ADC 210 may output a digital signal having a decreased data rate, thereby improving the connectivity between the ADC 210 and the DSP unit 220. For example, a DPD system 850 using the sampling matrix $D_{blkones}$ may achieve better performance than the DPD system 600 of FIG. 6, where the system model for the unknown system is a nonlinear memoryless model. However, in some examples, the system model for the unknown system is a nonlinear memory model, and such a DPD system 850 using the sampling matrix $D_{blkones}$ may not achieve the desired performance. In those examples, the nonlinear memory model is frequency dependent. However, by using the sampling matrix $D_{blkones}$, the DPD system 850 only obtains the direct current information, and does not provide the frequency information required by the memory nonlinear model.

In various embodiments where the system model of the unknown system is a nonlinear memory model, block diagonal matrices $D_{randblk}$ and $D_{radeblk}$ may be used as the sampling matrix. Block diagonal matrices $D_{randblk}$ and $D_{radeblk}$ may be expressed as follows:

$$D_{randblk} = \text{diag}(f_1, f_2, \ldots, f_M, 0, \ldots, 0),$$

where $f_i$ is a 1×R complex Gaussian random vector;

$$D_{radeblk} = \text{diag}(g_1, g_2, \ldots, g_M, 0, \ldots, 0),$$

where $g_i$ is a 1×R vector containing only random signs. In some examples, $D_{radeblk}$ is referred to as a block diagonal random sign matrix or a Rademacher matrix By selecting the elements of the $f_i$ and $g_i$ randomly, a mix of all frequencies is considered. As such, block diagonal matrices $D_{randblk}$ and $D_{radeblk}$ may be used for both nonlinear memoryless models and nonlinear memory models.

In the example of FIG. 8B, the sampling matrix unit 854A may include a random number generator (RNG) 856A for generating pseudo-random signs for the sampling matrix $D_{radeblk}$. The RNG 856A may include a linear-feedback shift register(LFSR) clocked by the clock signal 232, where the LFSR generates repeating sequences of pseudo-random numbers. In an example, the LFSR is implemented in hardware, which allows very fast pseudo-random number generation. For further example, the RNG 856A may use various pseudorandom number generator algorithms including, for example, a linear congruential generator. In some examples, the series of numbers generated by the RNG 856A are determined by the pseudorandom number generator algorithm and a seed. In various embodiments, the accumulator 852A may generate samples of z(n) by combining (e.g., by adding or subtracting) samples of the digital signal y(n) according to the random signs generated by the RNG 856A and/or the sampling matrix $D_{radeblk}$.

In some embodiments, as illustrated in FIG. 8B, the sampling matrix unit 854A may include a diagonal block width unit 858A, which may be used to tune the diagonal block width R of the sampling matrix $D_{radeblk}$. The performance (e.g., model identification time, MSE, NMSE of model error, DPD NMSE, DPD ACPR) of the DPD system 850 may be tuned by changing the diagonal block width R.

The method 700 may then proceed to block 710, where a model identification process is performed to determine coefficients of the model of the unknown system. Referring to FIG. 8B, the model identification unit 222 of the DSP unit 220 includes a coefficient determination unit 860, a sampling matrix unit 854B, a column signal generator 851, and an accumulator 852B. In some embodiments, the DSP unit 220 and the ADC 210 including its DSP unit 802 are located on the same die. In some examples, the DSP unit 802 of the ADC 210 is located adjacent to the conversion unit 212 of the ADC 210, while the DSP unit 220 is not adjacent to the ADC 210. Alternatively, in some examples, the ADC 210 is adjacent to the DSP unit 220. In some embodiments, the ADC 210 including its DSP unit 802 is located in a first die, and the DSP unit 220 is located in a second die different from the first die. In some embodiments, the DSP unit 802 is implemented using an application-specific integrated circuit (ASIC) in the ADC 210. In some embodiments, the DSP unit 220 is implemented in a PLD (e.g., an FPGA). In some examples, the ADC 210 may send the sampling matrix $D_{radeblk}$ to the model identification unit 222. However, in such examples, the data rate transferred from the ADC 210 to the DSP unit 220 may be increased by such transfer of the sampling matrix $D_{radeblk}$. Alternatively, in some examples as illustrated in FIG. 8B, instead receiving the sampling matrix $D_{radeblk}$ from the ADC 210, the model identification unit 222 uses a sampling matrix unit 854B to generate a sampling matrix $D_{radeblk}$ that matches the sampling matrix $D_{radeblk}$ of the ADC 210. As illustrated in FIG. 8B, the sampling matrix unit 854B may include a RNG 856B and a diagonal block width unit 858B that match the RNG 856A and the diagonal block width unit 858A respectively. In an example, the RNG 856B generates the same sequence of pseudorandom numbers. For example, the RNG 856B includes an LFSR implemented in hardware, which matches the LFSR of RNG 856A, and the LFSRs of the RNG 856A and the RNG 856B are synchronized (e.g., using the clock signal 232). In another example, both RNG 856A and RNG 856B use the same pseudorandom generator algorithm and the same seed, so that they generate the same sequence of pseudorandom numbers. In some examples, the diagonal block width units 858A and 858B provide the same value for the diagonal block width R of the sampling matrix $D_{radeblk}$ of the ADC 210 and the sampling matrix $D_{radeblk}'$.

In some embodiments, the column signal generator 851 may receive samples of the digital signal x(n) through the signal 224 from the predistortion unit 228, and transforms x(n) into digital signals 864-1 through 864-L, each corresponding to a column (kernel) of the matrix X. The digital signals 864-1 through 864-L may be generated based on the model of the unknown system 206. In an example, a nonlinear memoryless model of equation (4) is used as the model of the unknown system 206. As such, the digital signals 864-1 through 864-L correspond to x[n], . . . , and $|x[n]|^{l-1}x[n]$, . . . , and $|x[n]|^{L-1}x[n]$ respectively, where l is an integer between 1 and L. In another example, a memory polynomial of equation (3) is used as the model of the unknown system 206. In that example, the digital signals 864-1 through 864-L correspond to x[n], . . . , $|x[n-q]|^{P-1}x[n-q]$, . . . , $|x[n-Q]|^{P-1}x[n-Q]$ respectively, where L equals P*(Q+1).

The accumulator 852B may receive the digital signals 864-1 through 864-L from the column signal generator 851. For each column (kernel) of the L columns of the matrix X, the accumulator 852B generates elements of the matrix A by combining (e.g., by adding or subtracting) samples of the corresponding digital signal 864-i according to the corresponding elements of the sampling matrix $D_{radeblk}'$ where i is the column index of a particular column. The accumulator 852B may then send the resulting values of the matrix A to the coefficients determination unit 860.

In some embodiments, the coefficients determination unit 860 receives the signal 862 including the matrix A from the accumulator 852B, and receives the signal 804 including samples of z(n) from the compression unit 802 of the ADC 210. The coefficients determination unit 860 may then compute the coefficients ĉ as follows:

$$\hat{c} = (A^H A)^{-1} A^H z.$$

In some embodiments, the coefficients determination unit 860 sends a signal 226 including the computed coefficients ĉ to the predistortion unit 228.

The method 700 may then proceed to block 712, where a predistortion process is performed to a fourth digital signal to generate the first digital signal to compensate for the distortion caused by the unknown system. Referring to FIGS. 8A and 8B, the predistortion unit 228 receives the signal 226 including the coefficients ĉ for the model of the unknown system 206/power amplifier 604, and predistort the signal 226 based on the coefficients ĉ and the identified model for the unknown system.

Figure 11B:
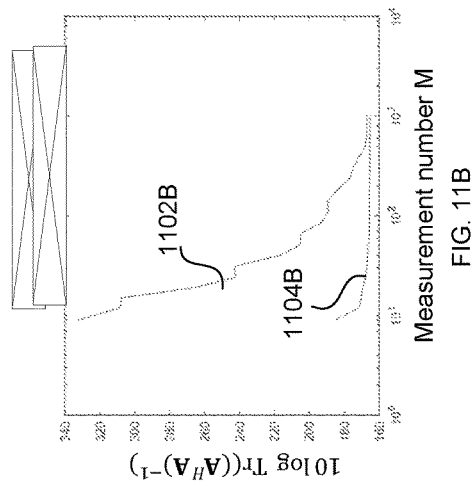
FIGS. 11A, 11B, 11C, 11D, 11E, and 11F illustrate performance comparison between various embodiments according to the present disclosure.
Figure 11D:
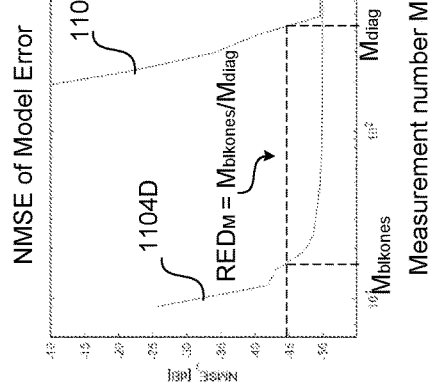
Figure 11A:
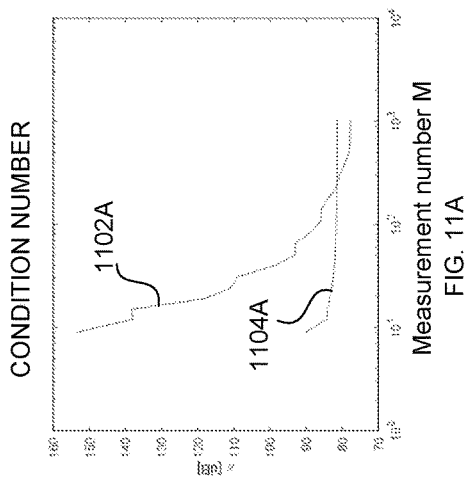
Figure 11C:
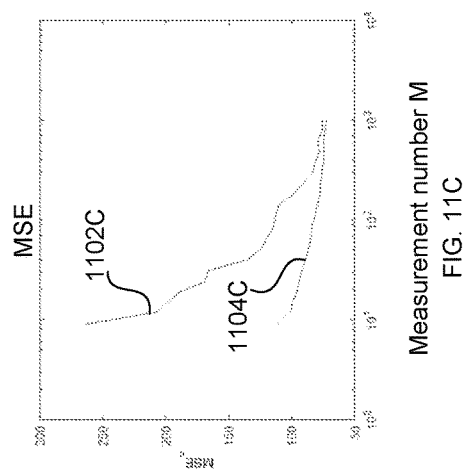

Referring to FIGS. 11A through 11E, illustrated are the performance comparison of a DPD system 850 using a sampling matrix $D_{blkones}$ and a DPD system 600. As shown in FIGS. 11A through 11E, with a nonlinear memoryless model for the unknown system, the performance of the DPD system is improved. In the illustrated examples, a nonlinear memoryless model including a ninth order Taylor series as shown in equation (4) are used, where the unknown coefficient number L is nine. The DPD system 850 uses a sampling matrix $D_{blkones}$ with a diagonal block width R having a value of 64. Curves 1102A, 1102B, 1102C, 1102D, 1102E, and 1102F correspond to performance curves of the DPD system 600. Curves 1104A, 1104B, 1104C, 1104D, 1104E, and 1104F correspond to performance curves of the DPD system 850. Specifically, curves 1102A and 1104A of FIG. 11A illustrate the condition number K with respect to the measurement number M. Curves 1102B and 1104B of FIG. 11B illustrate $Tr(A^H A)^{-1})$ with respect to the measurement number M. Curves 1102C and 1104C of FIG. 11C illustrate the MSE with respect to the measurement number M.

Referring to FIG. 11D, curves 1102D and 1104D illustrate the NMSE of the model error with respect to the measurement number M. As shown in FIG. 11D, a significantly smaller measurement number $M_{blkones}$ may be used in the DPD system 850 while achieving the same error (e.g., the NMSE of model error) as the DPD system 600 using a measurement number $M_{diag}$. A measurement number reduction factor $RED_M$ may be defined as:

$$RED_M = M_{blkones}/M_{diag}.$$

Figure 11F:
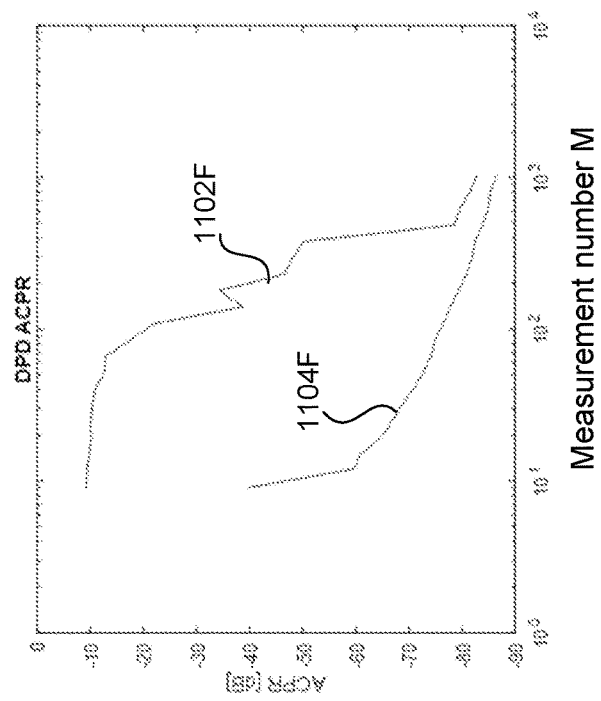
Figure 11E:
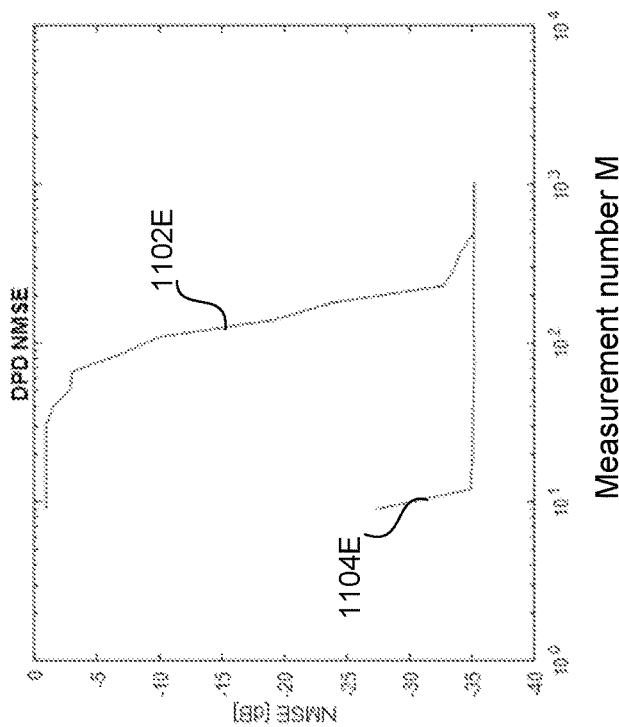

Referring to FIG. 11E, curves 1102E and 1104E illustrate the NMSE of the DPD system with respect to the measurement number M. Referring to FIG. 11F, curves 1102F and 1104F illustrate the ACPR of the DPD system with respect to the measurement number M. As shown in FIGS. 11A-11F, by using the sampling matrix $D_{blkones}$, the performance of the DPD system is improved. Note that the measurement number $M_{blkones}$ corresponds to the row number of the sampling matrix $D_{blkones}$, and each measurement of the DPD system 850 corresponds to R samples of y(n).

Figure 12A:
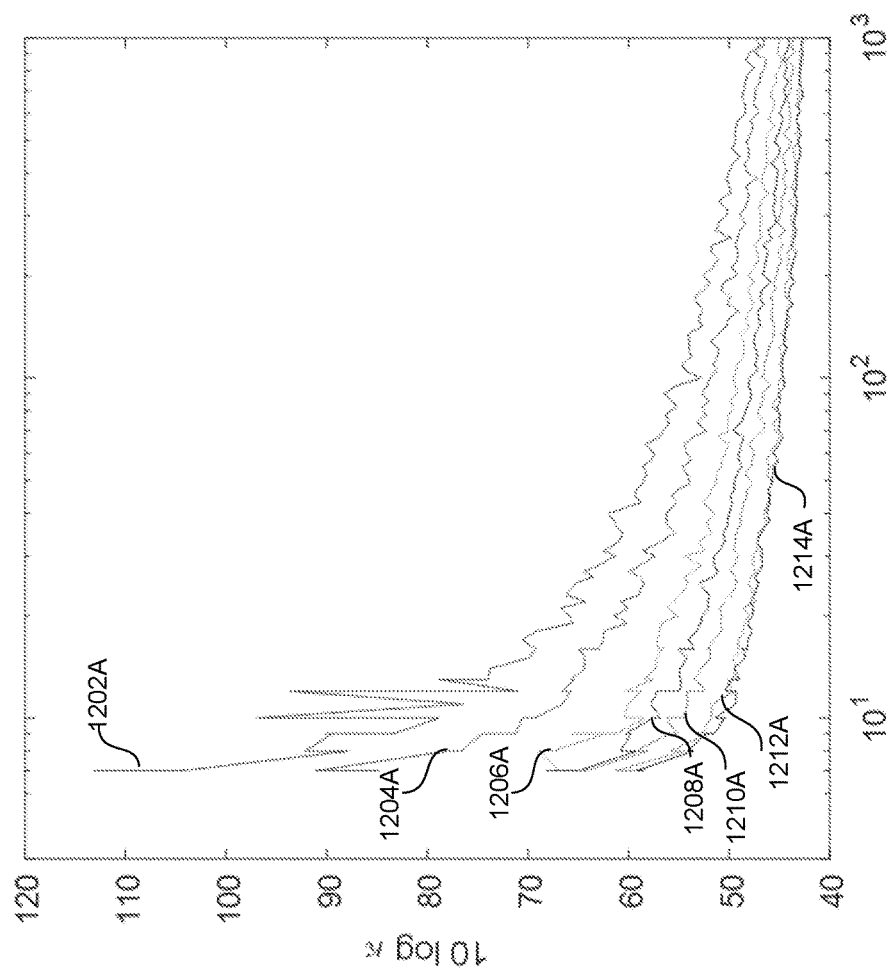
FIGS. 12A and 12B illustrate performance comparison between various embodiments according to the present disclosure.
Figure 12B:
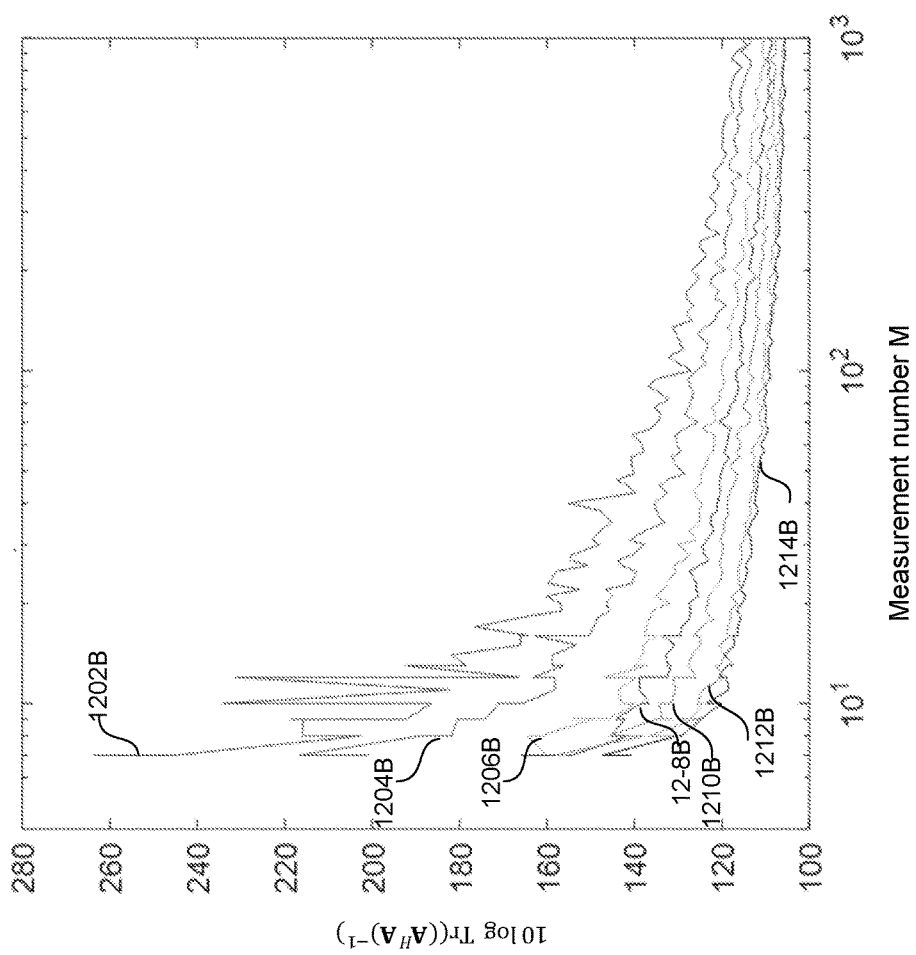

Referring to FIGS. 12A and 12B, a DPD system 850 using a sampling matrix $D_{blkdiag}$ may be tuned to achieve desired performance by tuning the diagonal block width R of the sampling matrix $D_{blkdiag}$. In the particular example, the sampling matrix $D_{blkdiag}$ is used, and a memory polynomial of equation (3) is used, which has a nonlinearity order L of eleven and a memory depth Q of three, and a nonlinear memoryless model is used to model the unknown system. Referring to FIGS. 12A and 12B, in some embodiments, the diagonal block width R may be tuned to improve the spectral properties of A. As shown in FIG. 12A, by using a larger diagonal block width R, the condition number K is improved. FIG. 12A includes curves 1202A, 1204A, 1206A, 1208A, 1210A, 1212A, and 1214A corresponding to diagonal block widths R having values of 1, 2, 5, 10, 20, 60, and 100 respectively. For a particular measurement number M, the condition number K decreases when the diagonal block width R increases. Note that the improvement (the decrease) in the condition number K achieved by increasing the compression sample number R saturates quickly. For example, the improvement in the condition number K achieved by increasing the diagonal block width R from two to five as shown by curves 1204A and 1206A is much greater than the improvement achieved by increasing the diagonal block width R from five to ten as shown by curves 1206A and 1208A.

Similarly, as shown in FIG. 12B, by using a larger diagonal block width R, the $Tr((A^H A)^{-1})$ is improved. FIG. 12B includes 1202B, 1204B, 1206B, 1208B, 1210B, 1212B, and 1214B corresponding to diagonal block widths R having values of 1, 2, 5, 10, 20, 60, and 100 respectively. As shown by the curves 1202B through 1214B, for a particular measurement number M, the $Tr((A^H A)^{-1})$ decreases when the diagonal block width R increases. In some embodiments, the improvement (the decrease) in the $Tr((A^H A)^{-1})$ achieved by increasing the diagonal block width R saturates quickly. For example, the improvement in the $Tr((A^H A)^{-1})$ achieved by increasing the diagonal block width R from two to five as shown by curves 1204B and 1206B is much greater than the improvement achieved by increasing the diagonal block width R from five to ten as shown by curves 1206B and 1208B.

Figure 13:
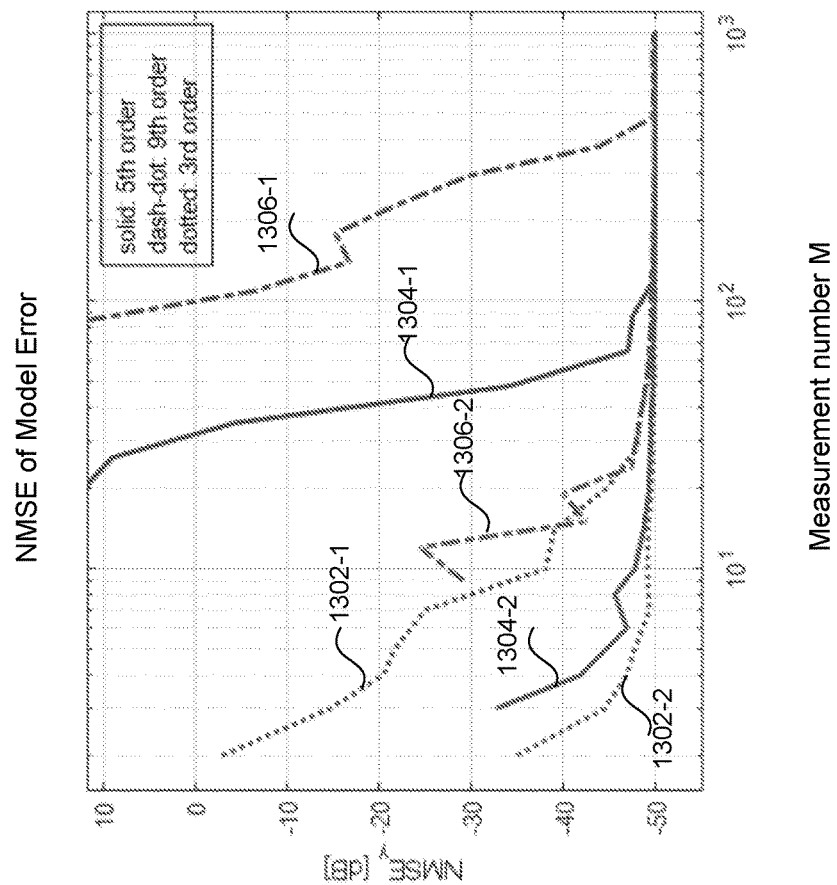
FIG. 13 illustrates performance comparison between various embodiments according to the present disclosure.
Figure 14A:
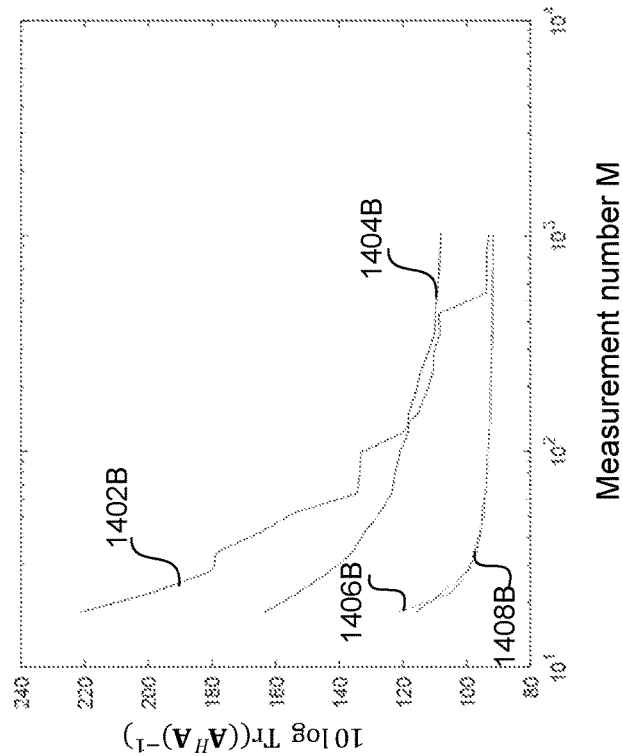
FIGS. 14A, 14B, 14C, and 14D illustrate performance comparison between various embodiments according to the present disclosure.
Figure 14B:
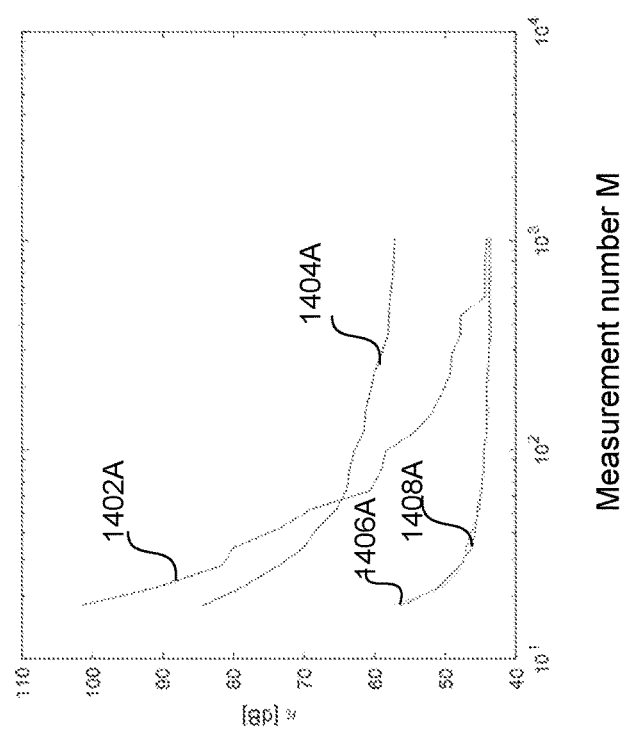
Figure 14D:
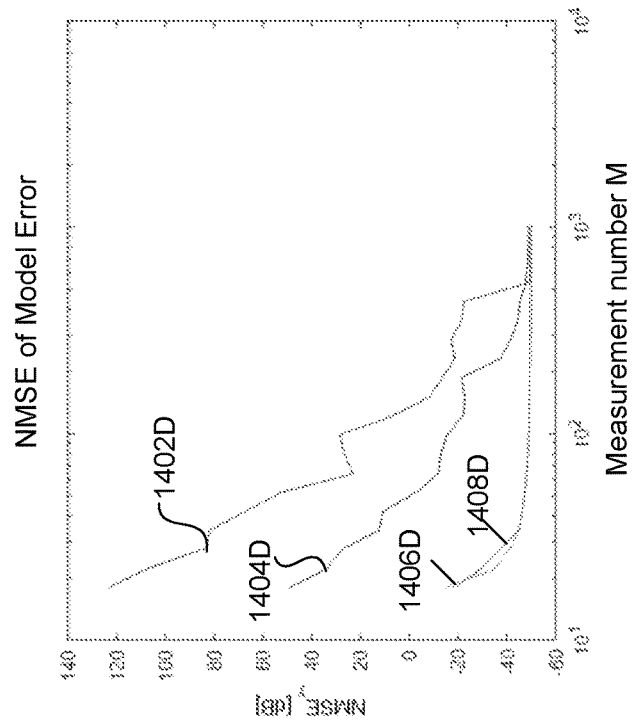
Figure 14C:
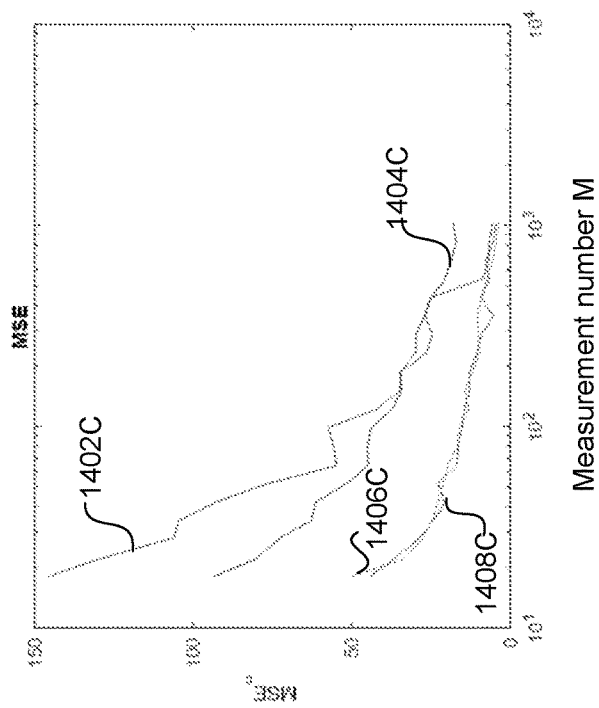

In various embodiments, the DPD system using a $D_{blkdiag}$ (e.g., DPD systems 800 and 850) may be used with models including various types of basis functions for the unknown system/power amplifier. For example, the model may use arbitrary basis functions. For further example, the model may be a decomposed vector rotation (DVR) model may use piecewise-linear (PWL) basis functions. For further example, the model may include orthogonal polynomial basis functions, which may be computationally complex. In various embodiments, when the model has a higher nonlinearity order, the performance advantage of the DPD system using a $D_{blkdiag}$ may be greater compared to a DPD system (e.g., DPD systems 200 and 600) that uses a sampling matrix $D_{diag}$. Referring to FIG. 13, illustrated are curves 1302-1, 1302-2, 1304-1, 1304-2, 1306-1, and 1306-2 illustrating the NMSE of the model error of a first DPD system using $D_{diag}$ and a second DPD system using a $D_{blkdiag}$. The first and second DPD systems use the same model (e.g., a nonlinear memoryless model using the Taylor series) with different truncated terms. Curves 1302-1 and 1302-2 correspond to that model with truncated terms having a nonlinearity order equal to three. Curves 1304-1 and 1304-2 correspond to that model with truncated terms having a nonlinearity order equal to five. Curves 1306-1 and 1306-2 correspond to that model with truncated terms having a nonlinearity order equal to nine. Further, curves 1302-1, 1304-1, and 1306-1 correspond to the first DPD system, and curves 1302-2, 1304-2, and 1306-2 correspond to the second DPD system. As illustrated in FIG. 13, the second DPD system has a better performance than the first DPD system, and the advantage of the second DPD system is greater when the nonlinearity order of the model is higher. For example, the differences between curves 1302-1 and 1302-2 are less than the differences between curves 1306-1 and 1306-2.

Referring to FIGS. 14A, 14B, 14C, and 14D, illustrated are the performance comparison of DPD systems using $D_{diag}$, $D_{blkones}$, $D_{radeblk}$, and $D_{randblk}$ respectively, where the model of the unknown system includes memory effects. A memory polynomial of equation (3) is used, which has a nonlinearity order L of eleven and a memory depth Q of three. The curve 1402A of FIG. 14A, the curve 1402B of FIG. 14B, the curve 1402C of FIG. 14C, and the curve 1402D of FIG. 14D correspond to a first DPD system (e.g., a DPD system 600) using a sampling matrix $D_{diag}$. The curve 1404A of FIG. 14A, the curve 1404B of FIG. 14B, the curve 1404C of FIG. 14C, and the curve 1404D of FIG. 14D correspond to a second DPD system (e.g., a DPD system 850) using a sampling matrix $D_{blkones}$. The curve 1406A of FIG. 14A, the curve 1406B of FIG. 14B, the curve 1406C of FIG. 14C, and the curve 1406D of FIG. 14D correspond to a third DPD system (e.g., a DPD system 850) using a sampling matrix $D_{radeblk}$ is used. The curve 1408A of FIG. 14A, the curve 1408B of FIG. 14B, the curve 1408C of FIG. 14C, and the curve 1408D of FIG. 14D correspond to a fourth DPD system (e.g., a DPD system 850) using a sampling matrix $D_{randblk}$.

As shown in FIGS. 14A-14D, the performance of the DPD system is improved significantly by using $D_{radeblk}$ (e.g., the third DPD system) and $D_{randblk}$ (e.g., the fourth DPD system), which consider a mix of all frequencies by including random elements in the sampling matrix. Further, there are no significant difference between the performances of the third DPD system using $D_{radeblk}$ and the fourth DPD system using $D_{randblk}$. As such, in some embodiments, because the implementation using $D_{radeblk}$ is significantly simpler than using $D_{randblk}$, the $D_{radeblk}$ may be chosen over the $D_{randblk}$ for improving the performance of a DPD system.

Figure 15A:
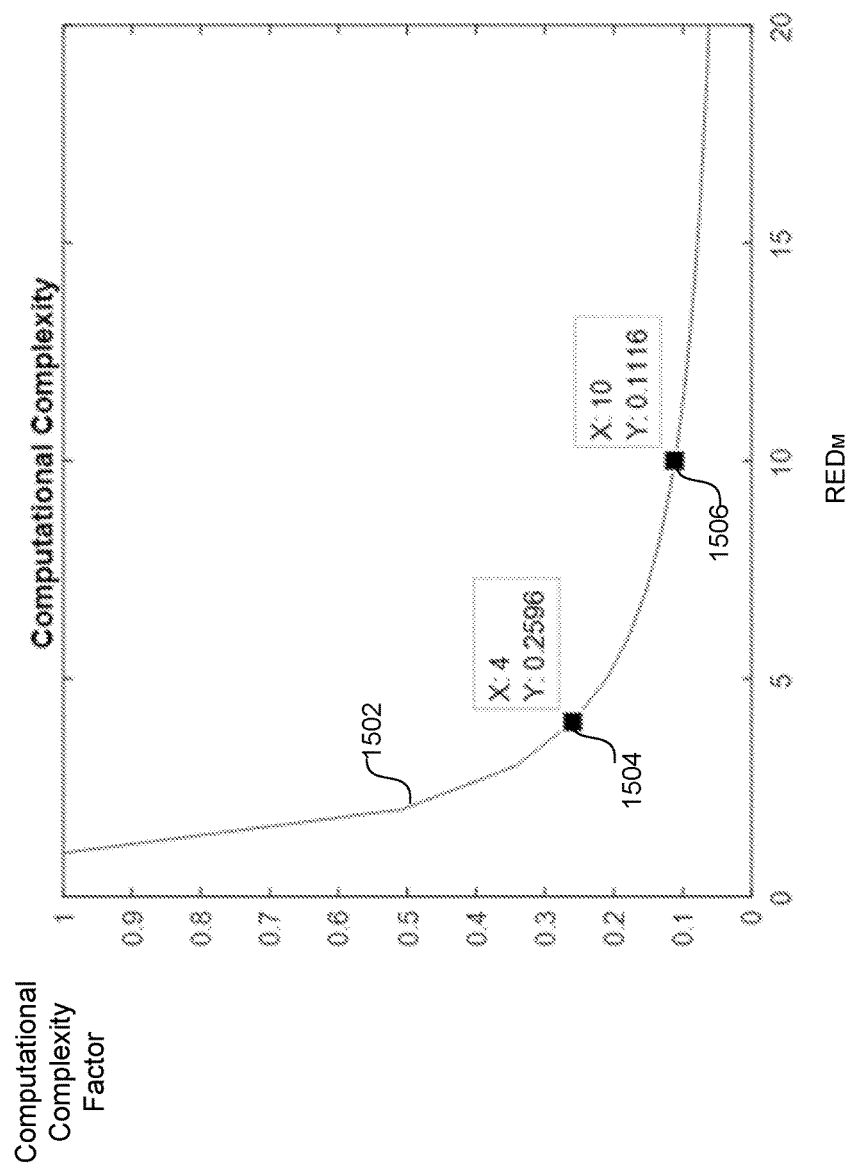
FIGS. 15A and 15B illustrate performance comparison between various embodiments according to the present disclosure.
Figure 15B:
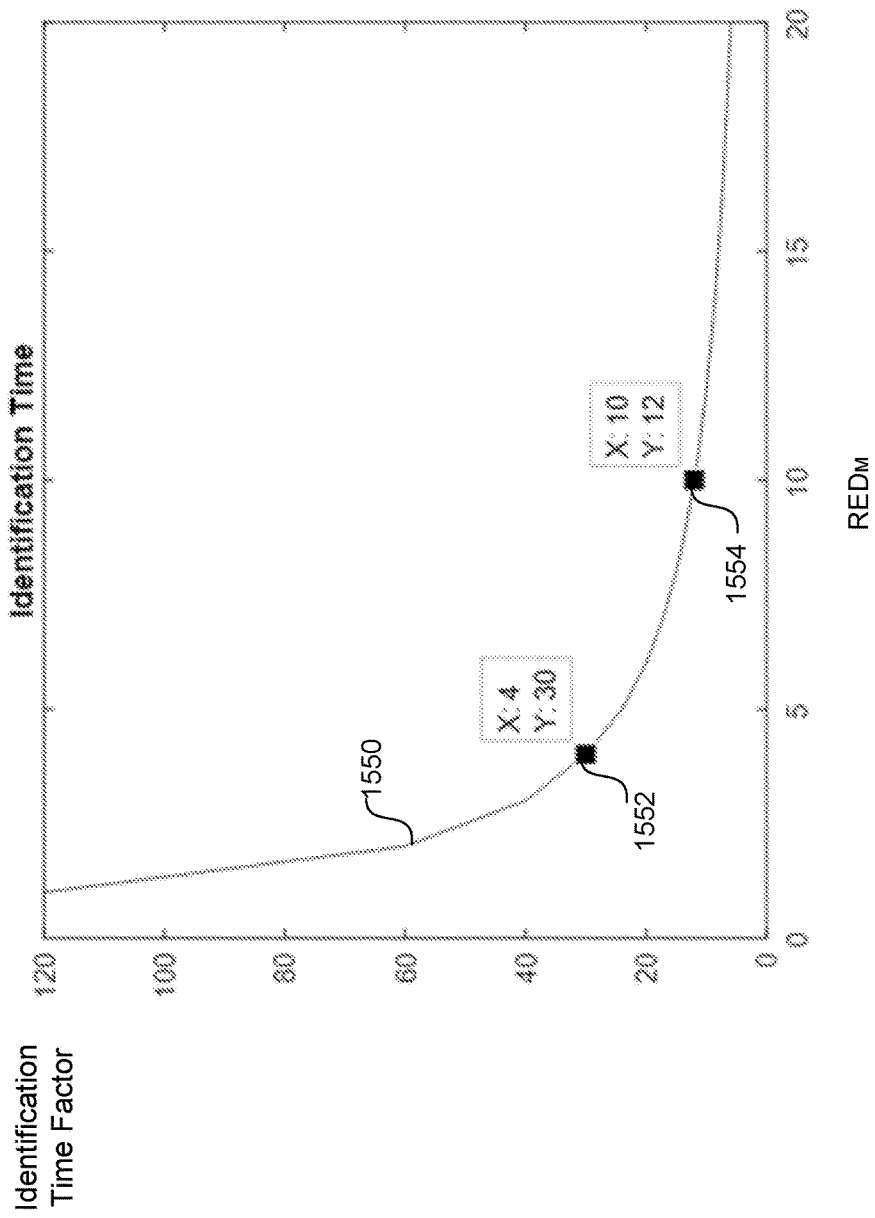

Referring to FIGS. 15A and 15B, a computational complexity curve 1502 and an identification time curve 1550 of the DPD system with respect to a measurement number reduction factor $RED_M$ are illustrated respectively. The measurement number reduction factor $RED_M$ is defined by measurement numbers of a first DPD system using a sampling matrix $D_{diag}$ and a second DPD system using a sampling matrix $D_{blkdiag}$. The measurement number reduction factor $RED_M$ may be defined as follows:

$$RED_M = M_{blkdiag}/M_{diag},$$

where $M_{diag}$ is the measurement number of the first DPD system, and $M_{blkdiag}$ is the measurement number of the second DPD system.

In various embodiments, because the second DPD system may use a measurement number $M_{blkdiag}$ less than $M_{diag}$ while still yielding the same NMSE and/or ACPR, the model identification problem may solve a smaller least squares system as follows:

$$O_{LS} = L^2\left(\frac{M_{diag}}{R_M}\right) = \frac{2}{3}L^3,$$

where L is the total number of coefficients of the system model of the unknown system.

Because most of the overhead caused by using the sampling matrix $D_{blkdiag}$ includes just addition and deduction, by allowing a smaller least squares system to be solved for the model identification system, the computational complexity of the DPD system is reduced.

In the example of FIGS. 15A and 15B, the second DPD system uses a sampling matrix $D_{radeblk}$. As shown by FIG. 15A, the point 1504 corresponds to a first configuration where the first DPD system and the second DPD system have the same ACPR. The point 1506 corresponds to a second configuration where there is a drop of about 1 dB in the ACPR performance of the second DPD system compared to that of the first DPD system. As shown by the point 1504, under the first configuration, the measurement number factor $RED_M$ has a value of four, where the computational complexity factor has a value of about 0.2596. This indicates that by using the sampling matrix $D_{radeblk}$ in the second DPD system, there is a computation complexity reduction of about 75% compared to the first DPD system. As shown by the point 1506, under the second configuration, the measurement number factor $RED_M$ has a value of 10, and the computational complexity factor has a value of about 0.1116, indicating that by using the sampling matrix $D_{radeblk}$ in the first DPD system, there is a computation complexity reduction of about 90% compared to the second DPD system.

As shown in FIG. 15B, the point 1552 corresponds to the first configuration where the first DPD system and the second DPD system have the same ACPR. The point 1554 corresponds to a second configuration where there is a drop of about 1 dB in the ACPR performance of the second DPD system compared to that of the first DPD system. As shown by the point 1552, under the first configuration, the measurement number factor $RED_M$ has a value of four, where the identification time factor has a value of thirty, indicating the identification time of the second DPD system is third times the identification time of the first DPD system. As shown by the point 1554, under the second configuration, the measurement number factor $RED_M$ has a value of 10, and the identification time factor has a value of about 12, indicating the identification time of the second DPD system is twelve times the identification time of the first DPD system.

It is noted that in various embodiments, the identification time of a DPD system using $D_{blkdiag}$ may also be reduced by using a smaller diagonal block width R (e.g., from 120 to 60). In some examples, identification time $T_{id,diag}$ of a DPD system using a sampling matrix $D_{diag}$ may be computed as:

$$T_{id,diag} = M_{diag} * T_s.$$

Identification time $T_{id,blkdiag}$ of a DPD system using a sampling matrix $D_{blkdiag}$ may be computed as:

$$T_{id,blkdiag} = M_{blkdiag} * T_s = T_{id,diag} * R/RED_M.$$

On the other hand, the data rate between the ADC 210 and the DSP unit 220 increases when the diagonal block width R increases. Accordingly, by tuning the diagonal block width R and the measurement number $M_{blkdiag}$, a DPD system using a sampling matrix $D_{blkdiag}$ may achieve desired performance by balancing the identification time, the data rate between the ADC 210 and the DSP unit 220, the computational complexity, and the accuracy (e.g., measured by the DPD NMSE and DPD ACPR).

Figures 16A, 16B:
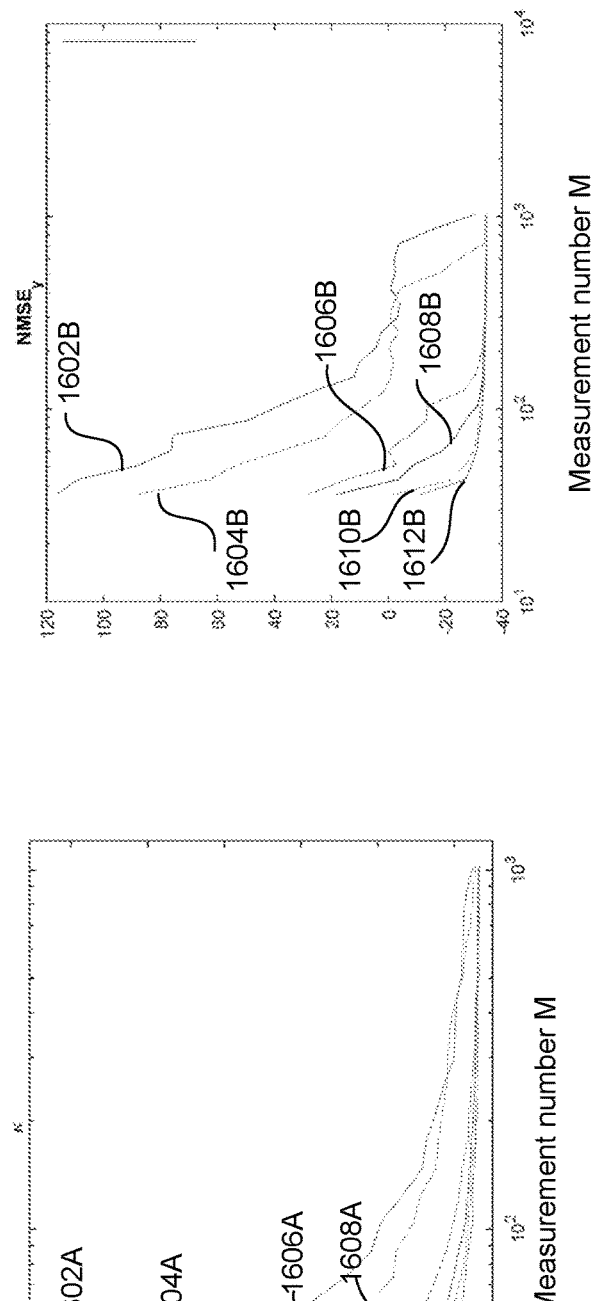
FIGS. 16A, 16B, 16C, and 16D illustrate performance comparison between various embodiments according to the present disclosure.
Figure 16D:
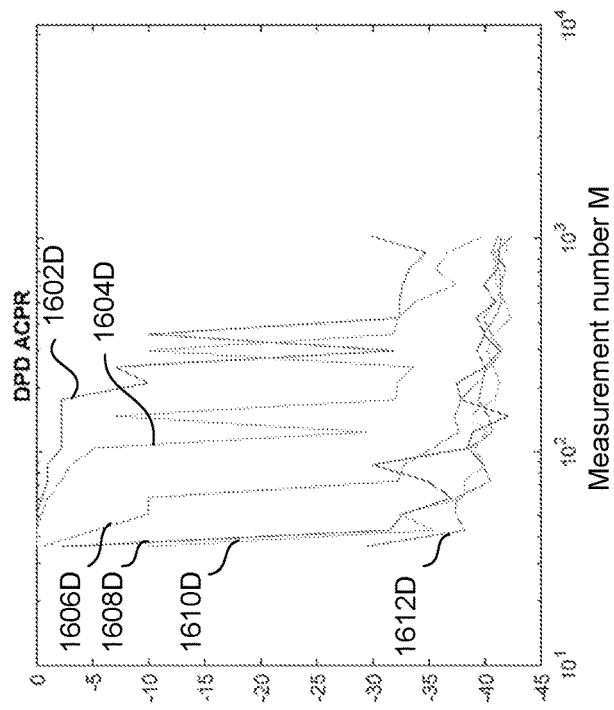
Figure 16C:
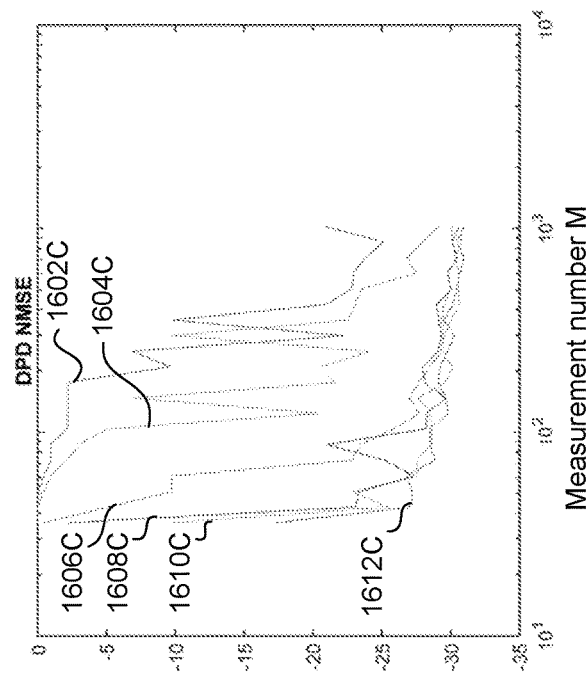

Referring to FIGS. 16A, 16B, 16C, and 16D, illustrated are the performance comparison of DPD systems 850 using sampling matrices $D_{radeblk}$ and $D_{randblk}$ having various diagonal block widths R and a DPD system 600 using $D_{diag}$. Those DPD systems use the same unknown system and the same memory polynomial model of equation (3). Specifically, a memory polynomial model having a polynomial order P equal to nine and a memory depth Q equal to three are used to model that unknown system. As shown in FIGS. 16A through 16D, the performance of the DPD system is improved when the diagonal block width R is increased. Referring to FIG. 16A, curves 1602A, 1604A, 1606A, 1608A, 1610A, and 1612A illustrate the condition number K of various DPD systems with respect to the measurement number M. Referring to FIG. 16B, curves 1602B, 1604B, B1606B, 1608B, 1610B, and 1612B illustrate the NMSE of the model error of various DPD systems with respect to the measurement number M. Referring to FIG. 16C, curves 1602C, 1604C, 1606C, 1608C, 1610C, and 1612C illustrate the NMSE of the DPD systems with respect to the measurement number M. Referring to FIG. 16D, curves 1602D, 1604D, 1606D, 1608D, 1610D, and 1612D illustrate the ACPR of the DPD systems.

Specifically, curves 1602A, 1602B, 1602C, and 1602D correspond to performances of a DPD system 600 using $D_{diag}$. Curves 1604A, 1604B, 1604C, and 1604D correspond to performances of a DPD system 850 using $D_{radeblk}$ with al diagonal block width R having a value of four (4). Curves 1606A, 1606B, 1606C, and 1606D correspond to performances of a DPD system 850 using $D_{radeblk}$ with a diagonal block width R having a value of thirty-two (32). Curves 1608A, 1608B, 1608C, and 1608D correspond to performances of a DPD system 850 using $D_{radeblk}$ with a diagonal block width R having a value of sixty-four (64). Curves 1610A, 1610B, 1610C, and 1610D correspond to performances of a DPD system 850 using $D_{radeblk}$ with a diagonal block width R having a value of one hundred and twenty-eight (128). Curves 1612A, 1612B, 1612C, and 1612D correspond to performances of a DPD system 850 using $D_{randblk}$ with a diagonal block width R having a value of one hundred and twenty-eight (128).

As shown in the illustrated examples of FIGS. 16A through 16D, by using a diagonal block sampling matrix $D_{radeblk}$ or $D_{randblk}$, the performance of the DPD system is improved. Furthermore, by increasing the diagonal block width R of the diagonal block sampling matrix $D_{radeblk}$, the performance of the DPD system is improved. Additionally, as shown by curves 1610A through 1610C and curves 1612A through 1612C, there is no significant difference between the performances of the DPD systems 850 using sampling matrices $D_{radeblk}$ and $D_{randblk}$ having the same diagonal block width R. As such, the sampling matrix $D_{radeblk}$ may be chosen over the sampling matrix $D_{radeblk}$ in a DPD system because using the sampling matrix $D_{radeblk}$ simplifies implementation significantly.

It is noted that various configurations (e.g., R, M, L, P, Q, the ADC sampling rate $f_s$, the sampling matrix D, the unknown system, the model for the unknown system) illustrated in FIGS. 2-16D are exemplary only and not intended to be limiting beyond what is specifically recited in the claims that follow. It will be understood by those skilled in the art that other configurations may be used. In various examples, the configurations of the DPD system (e.g., R and M) may be used to achieve the desired performance of the DPD system.

Various advantages may be present in various applications of the present disclosure. No particular advantage is required for all embodiments, and different embodiments may offer different advantages. One of the advantages of some embodiments is that by pre-compressing data after obtaining samples at the sampling rate of the ADC, the output data rate of the ADC is reduced. For example, the ADC may accumulate R samples to generate an accumulated sample, and output the accumulated sample at a rate that is R times lower than the sampling rate of the ADC. Another advantage of some embodiments is that by using a sampling matrix chosen based on the model of the unknown system, a DPD system may use a smaller number of measurements for model identification without performance (e.g., NMSE, ACPR) degradation. As such, by using a proper sampling matrix, computation efficiency of the model identification and predistortion process is improved. Yet another advantage of some embodiments is that by using the sampling matrix, the DPD system provides the flexibility to trade off identification time for better data rate, accuracy, and computational performance and vice versa (e.g., by tuning the diagonal block with R and the measurement number M).

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A model identification system, comprising:
   an analog to digital converter (ADC) including:
      a conversion circuit configured to receive a first analog signal and generate a first digital signal including samples having a first rate by sampling the first analog signal at the first rate; and
      a first digital signal processing (DSP) circuit configured to generate a second digital signal including samples having a second rate less than the first rate based on the first digital signal and a first sampling matrix,
         wherein the first sampling matrix is a block diagonal matrix including a plurality of diagonal blocks, each diagonal block is being a row vector including a plurality of elements.

2. The model identification system of claim 1, further comprising:
   a first system configured to generate the first analog signal based on a second analog signal, and provide the first analog signal to the ADC, wherein the second analog signal is generated based on a third digital signal; and
   a second DSP circuit coupled to the ADC and including:
      a model identification unit configured to receive the second digital signal and the third digital signal, and determine coefficients for a model of the first system based on the second digital signal, the third digital signal, and a second sampling matrix that matches the first sampling matrix.

3. The model identification system of claim 2, wherein the first DSP circuit and the second DSP circuit are synchronized.

4. The model identification system of claim 2, wherein the model identification unit is configured to determine the coefficients of the model of the first system using least squares (LS).

5. The model identification system of claim 2, wherein the second DSP circuit includes:
   a predistortion unit configured to receive a fourth digital signal and generate the third digital signal by predistorting the fourth digital signal based on the coefficients for the model of the first system.

6. The model identification system of claim 5, wherein the first system is a non-linear power amplifier.

7. The model identification system of claim 2, wherein the first sampling matrix is a diagonal block random sign matrix, and
   wherein the first DSP circuit includes:
      a first random number generator configured to provide a first sequence of random signs for the first sampling matrix.

8. The model identification system of claim 7, wherein the first random number generator includes a first linear-feedback shift register configured to generate the first sequence of random signs.

9. The model identification system of claim 7, wherein the model identification unit includes:
   a second random number generator configured to provide a second sequence of random signs for the second sampling matrix, wherein the second sequence of random signs match the first sequence of random signs.

10. The model identification system of claim 1, wherein the first DSP circuit is configured to generate a first sample of the second digital signal based on a plurality of consecutive samples of the first digital signal, and
    wherein a first size of the plurality of consecutive samples equals a second size of the elements of the row vector.

11. A method, comprising:
    receiving, by an analog to digital converter (ADC), a first analog signal;
    generating, by a conversion circuit of the ADC, a first digital signal including samples having a first rate by sampling the first analog signal at the first rate; and
    generating, by a first digital signal processing (DSP) circuit of the ADC, a second digital signal including samples having a second rate less than the first rate based on the first digital signal and a first sampling matrix,
       wherein the first sampling matrix is a block diagonal matrix including a plurality of diagonal blocks, each diagonal block is being a row vector including a plurality of elements.

12. The method of claim 11, further comprising:
generating, by a first system, the first analog signal based on a second analog signal, and provide the first analog signal to the ADC, wherein the second analog signal is generated based on a third digital signal;
receiving, by a model identification unit of a second DSP circuit, the second digital signal from the ADC and the third digital signal; and
determining, by a model identification unit, coefficients for a model of the first system based on the second digital signal, the third digital signal, and a second sampling matrix that matches the first sampling matrix.

13. The method of claim 12, further comprising:
synchronizing the first DSP circuit and the second DSP circuit.

14. The method of claim 12, further comprising:
determining the coefficients of the model of the first system using least squares (LS).

15. The method of claim 12, further comprising:
receiving a fourth digital signal; and
generating the third digital signal by predistorting the fourth digital signal based on the coefficients of the model of the first system.

16. The method of claim 15, further comprising:
providing a non-linear power amplifier as the first system.

17. The method of claim 12, wherein the first sampling matrix is a diagonal block random sign matrix, further comprising:
providing, by a first random number generator, a first sequence of random signs for the first sampling matrix.

18. The method of claim 17, further comprising:
providing, by a first linear-feedback shift register, the first sequence of random signs.

19. The method of claim 17, further comprising:
generating, by a second random number generator, a second sequence of random signs matching the first sequence of random signs; and
generating the second sampling matrix using the first sequence of random signs.

20. The method of claim 11, further comprising:
generating a first sample of the second digital signal based on a plurality of consecutive samples of the first digital signal, wherein a first size of the plurality of consecutive samples equals a second size of the elements of the row vector of the first sampling matrix.

* * * * *